United States Patent
Fox et al.

(10) Patent No.: US 8,709,551 B2
(45) Date of Patent: *Apr. 29, 2014

(54) SMOOTH SILICON-CONTAINING FILMS

(75) Inventors: Keith Fox, Tigard, OR (US); Dong Niu, West Linn, OR (US); Joe Womack, Tigard, OR (US); Mandyam Sriram, Beaverton, OR (US); George Andrew Antonelli, Portland, OR (US); Bart van Schravendijk, Sunnyvale, CA (US); Jennifer O'Loughlin, Portland, OR (US)

(73) Assignee: Novellus Systems, Inc., Fremont, CA (US)

( * ) Notice: Subject to any disclaimer, the term of this patent is extended or adjusted under 35 U.S.C. 154(b) by 355 days.

This patent is subject to a terminal disclaimer.

(21) Appl. No.: 12/970,853

(22) Filed: Dec. 16, 2010

(65) Prior Publication Data

US 2011/0236600 A1  Sep. 29, 2011

Related U.S. Application Data

(60) Provisional application No. 61/317,656, filed on Mar. 25, 2010, provisional application No. 61/382,465, filed on Sep. 13, 2010, provisional application No. 61/382,468, filed on Sep. 13, 2010, provisional application No. 61/394,707, filed on Oct. 19, 2010.

(51) Int. Cl.
| | |
|---|---|
| *C23C 16/509* | (2006.01) |
| *C23C 16/505* | (2006.01) |
| *C23C 16/455* | (2006.01) |
| *C23C 16/34* | (2006.01) |
| *C23C 16/40* | (2006.01) |
| *C23C 16/24* | (2006.01) |
| *H01L 21/02* | (2006.01) |
| *H01L 21/8229* | (2006.01) |

(52) U.S. Cl.
CPC ......... *C23C 16/505* (2013.01); *C23C 16/45523* (2013.01); *C23C 16/345* (2013.01); *C23C 16/402* (2013.01); *C23C 16/24* (2013.01); *C23C 16/509* (2013.01); *H01L 21/0214* (2013.01); *H01L 21/02104* (2013.01); *H01L 21/02123* (2013.01); *H01L 21/02129* (2013.01); *H01L 21/02164* (2013.01); *H01L 21/022* (2013.01); *H01L 21/02211* (2013.01); *H01L 21/02263* (2013.01); *H01L 21/02274* (2013.01); *H01L 21/0254* (2013.01); *H01L 21/0217* (2013.01); *H01L 21/8229* (2013.01)
USPC .................. 427/578; 427/248.1; 427/255.27; 427/255.29; 427/97.1

(58) Field of Classification Search
USPC .................. 427/578, 569, 248.1, 255.23, 256
See application file for complete search history.

(56) References Cited

U.S. PATENT DOCUMENTS

| | | | | |
|---|---|---|---|---|
| 5,399,387 | A | * | 3/1995 | Law et al. ...................... 427/574 |
| 5,589,233 | A | * | 12/1996 | Law et al. ...................... 427/579 |
| 5,851,602 | A | * | 12/1998 | Law et al. ...................... 427/579 |
| 6,066,550 | A | | 5/2000 | Wang |
| 6,087,278 | A | | 7/2000 | Kim et al. |
| 6,207,574 | B1 | * | 3/2001 | Lee .............................. 438/703 |
| 6,235,650 | B1 | | 5/2001 | Yao |
| 6,407,011 | B1 | | 6/2002 | Ikeda et al. |
| 6,444,277 | B1 | * | 9/2002 | Law et al. ...................... 427/574 |
| 6,811,831 | B1 | * | 11/2004 | Koutny et al. ................. 427/578 |
| 6,962,859 | B2 | * | 11/2005 | Todd et al. .................... 438/482 |
| 7,635,651 | B2 | * | 12/2009 | Lee et al. ...................... 438/758 |
| 7,858,431 | B2 | * | 12/2010 | Isaka et al. ..................... 438/89 |
| 2002/0011656 | A1 | | 1/2002 | Swanson et al. |
| 2004/0011279 | A1 | | 1/2004 | Joo |
| 2004/0146661 | A1 | | 7/2004 | Kapoor et al. |
| 2005/0229848 | A1 | | 10/2005 | Shinriki et al. |
| 2006/0204673 | A1 | | 9/2006 | Takayasu et al. |
| 2007/0059942 | A1 | | 3/2007 | Hu et al. |
| 2007/0110918 | A1 | | 5/2007 | Yuda et al. |
| 2007/0215877 | A1 | * | 9/2007 | Kato et al. ...................... 257/66 |
| 2007/0264842 | A1 | | 11/2007 | Kim |
| 2008/0202688 | A1 | | 8/2008 | Wu et al. |
| 2008/0268176 | A1 | * | 10/2008 | Choi et al. ..................... 427/579 |
| 2009/0022908 | A1 | * | 1/2009 | Yang et al. .................... 427/579 |
| 2009/0095221 | A1 | | 4/2009 | Tam et al. |
| 2009/0104790 | A1 | | 4/2009 | Liang |

| | | | |
|---|---|---|---|
| 2009/0159119 | A1 | 6/2009 | Basol |
| 2010/0109065 | A1 | 5/2010 | Oh et al. |
| 2010/0184302 | A1 | 7/2010 | Lee et al. |
| 2010/0210093 | A1* | 8/2010 | Kato et al. .................. 438/488 |
| 2011/0018044 | A1 | 1/2011 | Lim et al. |
| 2011/0151142 | A1 | 6/2011 | Seamons et al. |
| 2011/0236594 | A1 | 9/2011 | Haverkamp et al. |
| 2012/0142172 | A1 | 6/2012 | Fox et al. |
| 2013/0157466 | A1 | 6/2013 | Fox et al. |
| 2013/0171834 | A1 | 7/2013 | Haverkamp et al. |
| 2013/0267081 | A1 | 10/2013 | Fox et al. |

FOREIGN PATENT DOCUMENTS

| | | |
|---|---|---|
| EP | 0 394 054 | 10/1990 |
| JP | 06240459 A * | 8/1994 |
| JP | 2000-208422 | 7/2000 |
| WO | WO2012/036808 | 3/2012 |
| WO | WO 2013/123143 | 8/2013 |

OTHER PUBLICATIONS

Viana et al. Analysis of SiO2 Thin Film Deposited by PECVD using an Oxygen-TEOS-Argon Mixture. Brazilian Journal of Physics, vol. 31, No. 2, Jun. 2001.*
Han et al. Modeling the Properties of PECVD Silicon Dioxide Films Using Optimzed Back-Propagation Neural Networks. IEE Transaction on Components, Packaging, and Manufacturing Technology—Part A, vol. 17., No. 2 Jun. 1994. pp. 174-182.*
U.S. Appl. No. 13/671,424, filed Nov. 7, 2012, entitled "In-Situ Deposition of Film Stacks," Haverkamp et al.
U.S. Appl. No. 13/766,696, filed Feb. 13, 2013, entitled "Silicon-Nitride Films for Semiconductor Device Applications," Fox et al.
U.S. Appl. No. 13/478,999, filed May 23, 2012, entitled "PECVD Deposition of Smooth Silicon Films," Hollister et al.
US Office Action dated Nov. 26, 2012 issued in U.S. Appl. No. 12/970,846.
International Search Report and Written Opinion mailed Apr. 9, 2012, issued in Application No. PCT/US2011/047107.
Ong, Y. et al., Process Analysis and Optimization on PECVD Amorphous Silicon on Glass Substrate, Journal of Physics: Conference Series, vol. 34, 2006, pp. 812-817.
U.S. Appl. No. 13/857,566, filed Apr. 5, 2013, entitled "Post-Deposition Soft Annealing," Fox et al.
U.S. Appl. No. 13/667,282, filed Nov. 2, 2012, entitled "Flow Balancing in Gas Distribution Networks," Womack et al.
US Final Office Action dated May 16, 2013 issued in U.S. Appl. No. 12/970,846.
Singapore Search Report and Written Opinion dated Apr. 18, 2013, issued in SG 201102162-3.
PCT International Preliminary Report on Patentability and Written Opinion dated Mar. 28, 2013, issued in PCT/US2011/047107.
PCT International Search Report and Written Opinion dated Jun. 3, 2013, issued in PCT/US2013/026069.
"Diaphragm Valves," (Oct. 2003) *Microelectronics Product Line, Catalog 4505/USA*, Parker Hannifin Corporation, pp. 1-49.
Jong, J., et al., "Vertical Cell Array Using TCAT (Terabit Cell Array Transistor) Technology for Ultra High Density NAND Flash Memory," *2009 Symposium on VLSI Technology Digest of Technical Papers*, 2009, pp. 192-193.
Kim, J., et al., "Novel Vertical-Stacked-Array-Transistor (VSAT) for Ultra-High-Density and Cost-Effective NAND Flash Memory Devices and SSD (Sold State Drive)," *2009 Symposium on VLSI Technology Digest of Technical Papers*, 2009, pp. 186-187.
Kim, W., et al., "Multi-Layered Vertical Gate NAND Flash Overcoming Stacking Limit for Terabit Density Storage," *2009 Symposium on VLSI Technology Digest of Technical Papers*, 2009, pp. 188-189.
Hoogeland et al., (2009) "Plasma-assisted atomic layer deposition of $TiN/Al_2O_3$ stacks for metal-oxide-semiconductor capacitor applications," *Journal of Applied Physics* 106, 114107-1-114107-7, 7pp.
Schmidt et al., (2001) "Surface Passivation of silicon solar cells using plasma-enhanced chemical-vapour-deposited SiN films and thin thermal $SiO_2$/plasma SiN stacks." *Semicond. Sci. Technol.*, 16:164-170.
Su, Chen-Yi, et al., (2012) "Deposition and characterization of MgO/Si gate stacks grown by molecular beam epitaxy," *Thin Solid Films* 520:4508-4511.
Viana et al. (Jun. 2001) "Analysis of $SiO_2$ Thin Film Deposited by PECVD Using an Oxygen-TEOS-Argon Mixture," *Brazilian Journal of Physics*, 31(2):299-303.
U.S. Appl. No. 13/907,742, filed May 31, 2013, entitled "Tensile Stressed Doped Amorphous Silicon," Fox et al.
US Office Action dated Sep. 11, 2013 issued in U.S. Appl. No. 12/970,846.
Moisan, M., et al., (Oct. 1987) "New surface wave launchers for sustaining plasma columns at submicrowave frequencies (1-300 MHz)" Rev. Sci. Instrum. 58(10):1895-1900.

* cited by examiner

*Primary Examiner* — David Turocy
(74) *Attorney, Agent, or Firm* — Weaver Austin Villeneuve & Sampson LLP

(57) ABSTRACT

Methods and hardware for depositing ultra-smooth silicon-containing films and film stacks are described. In one example, an embodiment of a method for forming a silicon-containing film on a substrate in a plasma-enhanced chemical vapor deposition apparatus is disclosed, the method including supplying a silicon-containing reactant to the plasma-enhanced chemical vapor deposition apparatus; supplying a co-reactant to the plasma-enhanced chemical vapor deposition apparatus; supplying a capacitively-coupled plasma to a process station of the plasma-enhanced chemical vapor deposition apparatus, the plasma including silicon radicals generated from the silicon-containing reactant and co-reactant radicals generated from the co-reactant; and depositing the silicon-containing film on the substrate, the silicon-containing film having a refractive index of between 1.4 and 2.1, the silicon-containing film further having an absolute roughness of less than or equal to 4.5 Å as measured on a silicon substrate.

23 Claims, 20 Drawing Sheets

SMOOTH SILICON-CONTAINING FILMS

CROSS REFERENCE TO RELATED APPLICATIONS

This application claims priority to U.S. Provisional Patent Application Ser. No. 61/317,656, titled "IN-SITU PLASMA-ENHANCED CHEMICAL VAPOR DEPOSITION OF FILM STACKS," and filed on Mar. 25, 2010; U.S. Provisional Patent Application Ser. No. 61/382,465, titled "IN-SITU PLASMA-ENHANCED CHEMICAL VAPOR DEPOSITION OF FILM STACKS," and filed on Sep. 13, 2010; U.S. Provisional Patent Application Ser. No. 61/382,468, titled "SMOOTH SILANE-BASED FILMS," and filed on Sep. 13, 2010; and U.S. Provisional Patent Application Ser. No. 61/394,707, titled "IN-SITU PLASMA-ENHANCED CHEMICAL VAPOR DEPOSITION OF FILM STACKS," and filed on Oct. 19, 2010, the entirety of which are hereby incorporated herein by reference for all purposes.

BACKGROUND

Patterning film stacks for three-dimensional (3D) memory devices can be difficult. Some conventional atomic layer deposition (ALD), chemical vapor deposition (CVD), high-density plasma chemical vapor deposition (HDP-CVD) and plasma-enhanced chemical vapor deposition (PECVD) processes for depositing film layers may produce unacceptably rough films, cause unacceptable interfacial mixing between film layers, and may have interfacial defects caused by vacuum breaks between successively deposited film layers. The resulting rough film interfaces and interfacial defects may be magnified by subsequently deposited layers as the film stack is built, so that the top surface of the film stack may be unacceptably rough for downstream patterning processes. Further, interfacial defects within the film stack may lead to structural and/or electrical defects in the 3D memory device.

SUMMARY

Various embodiments are described herein related to depositing ultra-smooth silicon-containing films. For example, one disclosed embodiment provides a method for forming a film stack including a first film and a second film on a substrate in-situ, the first film having a different material composition from the second film. The method includes, in a first film deposition phase, supplying a first reactant gas mixture to a process station, maintaining a first plasma using the first reactant gas mixture, with the first plasma, depositing the first film on the substrate; and in a second film deposition phase, and without an intervening vacuum break, supplying a second reactant gas mixture to the process station, maintaining a second plasma using the second reactant gas mixture, with the second plasma, depositing the second film on the substrate, and, controlling a process parameter of the second film deposition phase so that the absolute roughness of the second film decreases with increasing thickness of the second film.

Another disclosed embodiment includes supplying a silicon-containing reactant to the plasma-enhanced chemical vapor deposition apparatus; supplying a co-reactant to the plasma-enhanced chemical vapor deposition apparatus; supplying a capacitively-coupled plasma to a process station of the plasma-enhanced chemical vapor deposition apparatus, the plasma including silicon radicals generated from the silicon-containing reactant and co-reactant radicals generated from the co-reactant; and depositing the silicon-containing film on the substrate, the silicon-containing film having a refractive index of between 1.4 and 2.1, the silicon-containing film further having an absolute roughness of less than or equal to 4.5 Å as measured on a silicon substrate (i.e., as measured on a film deposited directly on a silicon substrate).

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
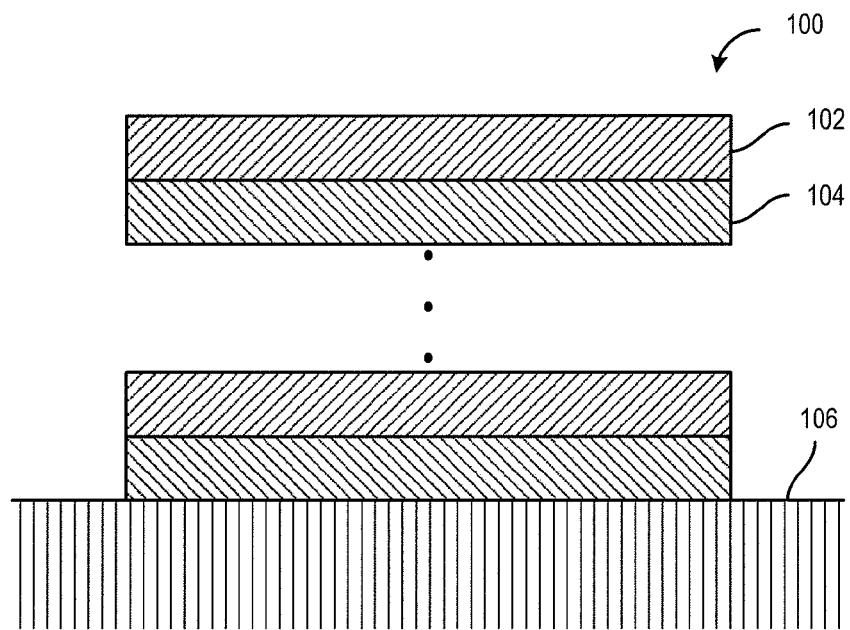
FIG. 1 schematically shows an example embodiment of a film stack including alternating layers of a first film and a second film deposited on a substrate.

Some memory devices, such as NAND flash memory, are arranged in two-dimensional arrays. Because such memory devices are limited to a planar arrangement, die size and memory density parameters may constrain the total memory capacity of the device. In turn, moving to larger die sizes to expand memory capacity may comparatively increase the cost of the memory device, which may delay adoption of larger capacity memory devices. Recently, some approaches for arranging memory gates into three-dimensional (3D) arrays have been proposed. Some of these approaches incorporate transistors formed by patterning stacks of alternating film composition. FIG. 1 schematically shows an example film stack 100 including alternating layers of first film 102 and second film 104 on a substrate 106.

Patterning such film stacks can be difficult. For example, rough film surfaces arising from deposition and/or film cracks caused by vacuum breaks between deposition events may cause ripples in subsequently deposited layers. As the film stack is built, these undulations may grow in size and may cause focus, exposure, and etch problems in downstream patterning operations. Thus, it is desirable for each layer to be highly smooth.

Some approaches for depositing such silicon dioxide films include using tetraethyl orthosilicate ($Si(OC_2H_5)_4$, or TEOS)-based plasma-enhanced chemical vapor deposition (PECVD) processes or silane-based PECVD processes. However, these conventional PECVD processes may produce unacceptably rough films. For example, conventional silane-based PECVD process for depositing $SiO_2$ exhibits an absolute roughness (Ra) of 7.2 Å for a 1000 Å film deposited on a bare silicon substrate while a conventional TEOS-based PECVD process for depositing $SiO_2$ exhibits an roughness of 4.5 Å Ra for a 1000 Å film deposited on a silicon substrate (i.e., as measured on a film deposited directly on a bare silicon substrate).

Figure 2:
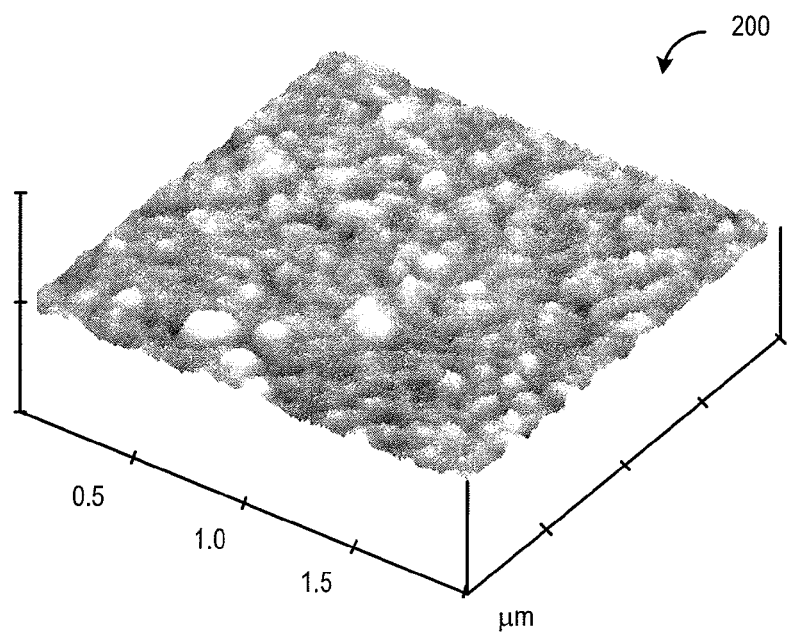
FIG. 2 shows an atomic force microscopy (AFM) image of a surface of an example tetraethyl orthosilicate (TEOS)-based plasma-enhanced chemical vapor deposition (PECVD) $SiO_2$ film deposited at the top of a film stack including 11 pairs of alternating $SiN/SiO_2$ layers.
Figure 3:
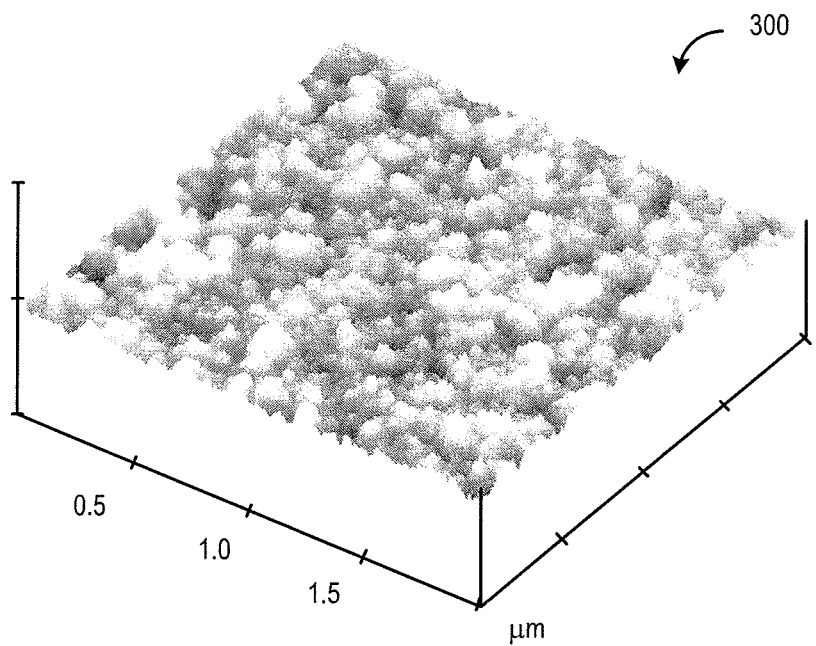
FIG. 3 shows an atomic force microscopy (AFM) image of a surface of an example conventional silane-based PECVD $SiO_2$ film deposited at the top of a film stack including 11 pairs of alternating $SiN/SiO_2$ layers.

The effect of stacking rough films can be cumulative, so that a top surface of the film stack may be rougher than the individual films. FIGS. 2 and 3 show surface roughness images for example $SiN/SiO_2$ film stacks measured by atomic force microscopy (AFM). FIG. 2 depicts an AFM image 200 of a film stack having 11 pairs of $SiN/SiO_2$ films using a TEOS-based PECVD SiO$_2$ deposition process. For reference, the roughness of a 1000 Å silicon nitride film deposited on a bare silicon substrate is 5.1 Å Ra.

In the example shown in FIG. 2, the TEOS-based SiO$_2$ film at the top of the film stack exhibits a roughness of approximately 9.9-10.6 Å Ra. FIG. 3 depicts an AFM image 300 of a film stack having 11 alternating pairs of SiN/SiO$_2$ films using a silane-based PECVD SiO$_2$ process (e.g., using silane at a flow rate of approximately 500-600 sccm). In the example shown in FIG. 3, the SiO$_2$ film has a roughness of approximately 17 to 19 Å Ra. Thus, it will be appreciated that the conventional PECVD SiO$_2$ processes may deposit films that are comparatively rougher than the underlying film.

Some other approaches for depositing smooth silicon dioxide films employ high-density plasma chemical vapor deposition (HDP-CVD) processes. However, HDP-CVD processes typically employ ion densities of greater than $2 \times 10^{10}$ ions/cm$^3$. Such high ion density deposition environments may unselectively sputter underlying films as the SiO$_2$ layer is deposited. This may lead to unacceptable interlayer oxidation, potentially leading to electrical defects or structural defects at the film interfaces. Further, HDP-CVD processes typically use inductively-coupled plasma sources, which are comparatively more expensive and are comparatively more likely to generate defects during process relative to the capacitively-coupled plasma sources used in PECVD processes. Moreover, because HDP-CVD process equipment may not be suitable for depositing more than one film composition in-situ, vacuum breaks may be required during processing, potentially leading to the inclusion of interlayer defects and additional equipment expense.

Accordingly, various embodiments are disclosed related to depositing ultra-smooth silicon-containing films using capacitively-coupled plasma sources, including dielectric films such as silicon oxides (e.g., SiO$_2$ and sub-oxides thereof), silicon oxynitrides, and silicon nitrides, and conductive films such as polycrystalline and amorphous silicon. In some embodiments, alternating layers of ultra-smooth silicon-containing films may be deposited in-situ in a process tool (e.g., without a vacuum break and/or air exposure between deposition phases). Example film stacks include, but are not limited to, alternating layers of silicon dioxide and silicon nitride, alternating layers of polycrystalline silicon and silicon dioxide, alternating layers of polycrystalline silicon and silicon nitride, and alternating layers of doped and undoped amorphous and/or polycrystalline silicon.

Figure 4:
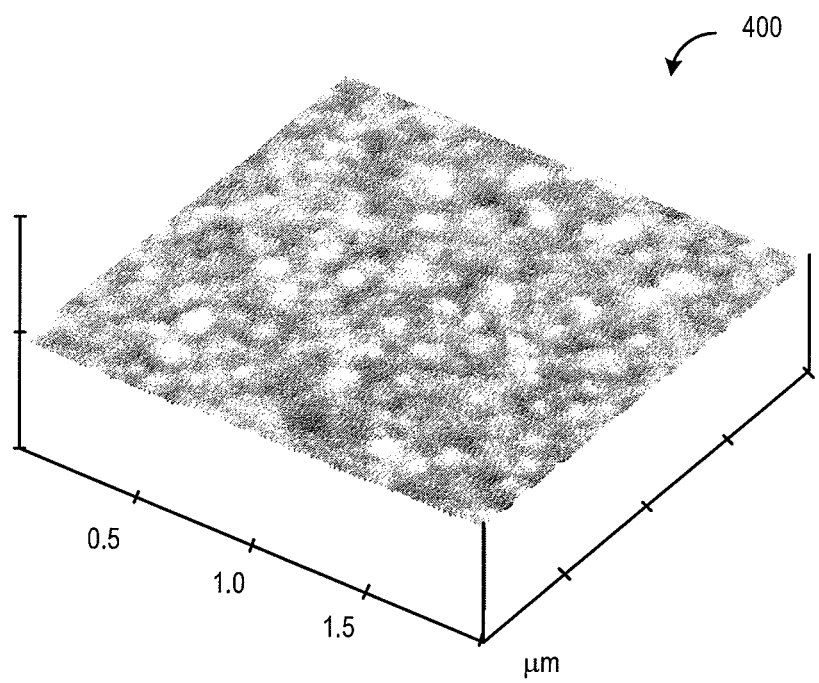
FIG. 4 shows an atomic force microscopy (AFM) image of a surface of an example ultra-smooth PECVD $SiO_2$ film deposited according to an embodiment of the present disclosure at the top of a film stack including 14 pairs of alternating $SiN/SiO_2$ layers.

As an example, FIG. 4 shows an AFM image 400 of an example film stack having 14 alternating pairs of a silicon nitride film and an ultra-smooth silicon dioxide film deposited according to an example of an ultra-smooth PECVD process of the present disclosure. In the example shown in FIG. 4, the ultra-smooth PECVD SiO$_2$ top layer has a roughness of approximately 4.6 Å Ra, exhibiting a greater than two-fold improvement in surface roughness compared to the conventional PECVD SiO$_2$ processes described above and shown in FIGS. 2 and 3, though some ultra-smooth PECVD silicon dioxide films (discussed in more detail below) deposited on silicon nitride surfaces exhibit roughness values of approximately 3.6 Å Ra. Further, as explained above, the roughness of a 1000 Å silicon nitride film deposited on a bare silicon substrate is 5.1 Å Ra. Thus, it will be appreciated that, in some embodiments, the ultra-smooth PECVD SiO$_2$ process may provide a top surface roughness that is less than a roughness of an underlying film. For example, in some embodiments, an ultra-smooth PECVD SiO$_2$ film may have an absolute roughness that is approximately 90% or less than the roughness of an underlying film.

Without wishing to be bound by theory, it is believed that, in some embodiments, the ultra-smooth character of ultra-smooth PECVD films may result from conditions where surface adsorption, rearrangement and/or assembly reactions occur at a substantially faster rate and/or in greater abundance than gas-phase polymerization and adsorption reactions. Under such conditions, the radicals generated in the plasma may be relatively more likely to be adsorbed to the substrate and link on the substrate surface than they are to react in the gas phase above the substrate.

Figure 5:
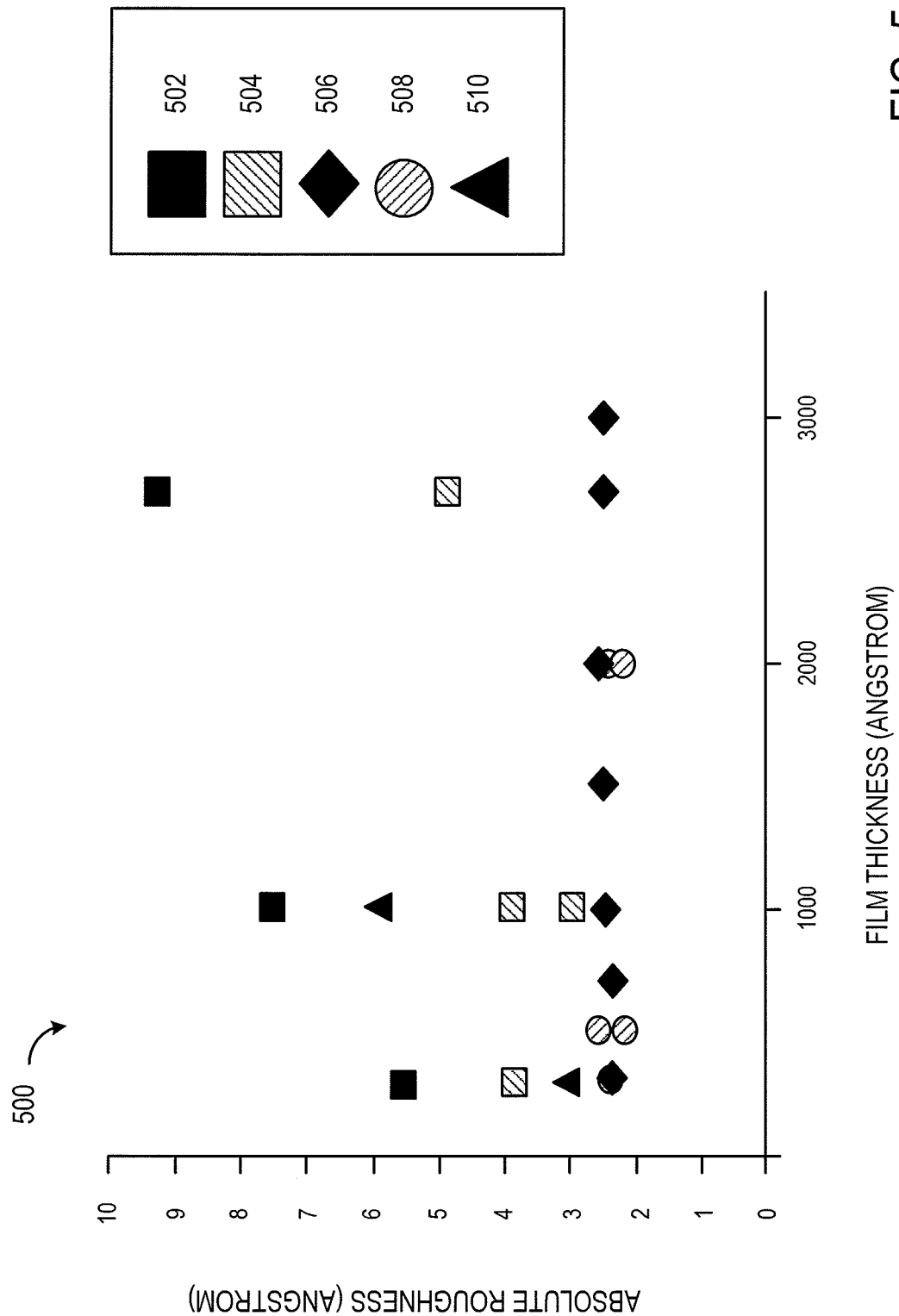
FIG. 5 graphically shows a comparison of absolute roughness between conventional PECVD and atomic layer deposition (ALD) $SiO_2$ films and example ultra-smooth PECVD $SiO_2$ films deposited according to embodiments of the present disclosure.

Thus, an ultra-smooth PECVD process according to the present disclosure may provide a film that has an absolute roughness that is substantially independent of film thickness. For example, in some examples, an ultra-smooth PECVD SiO$_2$ film may exhibit a surface roughness of less than or equal to 4.5 Å for film thicknesses of up to 3000 Å as measured on a silicon substrate. For example, FIG. 5 shows a graph 500 comparing surface absolute roughness as a function of film thickness for silicon dioxide films deposited on bare silicon substrates by various example processes, including a conventional silane-based PECVD process example (points 502), a conventional TEOS-based PECVD process example (points 504), and an example ultra-smooth silicon dioxide film deposited by an example ultra-smooth PECVD process according to the present disclosure (points 506). The example films made by conventional PECVD processes shown in FIG. 5 may be characterized as having gas-phase polymerization reactions that occur at a faster rate than surface assembly and rearrangement reactions. Thus, points 502 and points 504 trend toward increasing absolute roughness with increasing film thickness. In contrast, the example ultra-smooth PECVD silicon dioxide film shown in FIG. 5 exhibits a surface roughness of approximately 2.5 Å Ra for film thicknesses of up to 3000 Å while having a substantially constant absolute roughness.

FIG. 5 also shows a comparison between example silicon dioxide films deposited by high-density plasma chemical vapor deposition (HDP-CVD) processes and the ultra-smooth PECVD-deposited silicon dioxide film example discussed above. As shown in FIG. 5, the example ultra-smooth PECVD silicon dioxide film has approximately the same absolute surface roughness as the example HDP-CVD silicon dioxide film (points 508). However, as explained above, HDP-CVD processes may damage underlying films and may be unable to produce film stacks in-situ. In contrast, as explained in detail below, ultra-smooth PECVD films may be deposited without using high ion densities (e.g., with ion densities of less than $2 \times 10^{10}$ ions/cm$^3$) and therefore may maintain a comparatively sharp interfacial composition boundary with an underlying film. Further, ultra-smooth PECVD films may be deposited in-situ with other film processes, potentially avoiding vacuum breaks when building a film stack.

FIG. 5 also shows a comparison between an example SiO$_2$ film deposited by an atomic layer deposition (ALD) process (points 510) and the ultra-smooth PECVD film example described above. Like the conventional PECVD processes, the example film deposited by the ALD process exhibits a thickness-dependent increase in absolute roughness. While ALD processes theoretically deposit a monolayer of film at a time, differences in adsorption of the otherwise segregated deposition precursors may lead to the formation of condensed phase precursor domains (e.g., the surface may include both chemisorbed and physisorbed precursor). Such domains may lead to the creation of non-stoichiometric regions of the film, which may cause lattice defects and surface roughness in the film. Subsequently-deposited layers may magnify the effect of the surface roughness. Moreover, the layer-by-layer deposition process used in ALD may be comparatively more expensive than a PECVD process, both in throughput costs and in equipment costs.

In contrast, and without wishing to be bound by theory, the comparatively lower surface energies of flatter surfaces (e.g., surfaces approaching the native roughness of a thermodynamically stable terminated surface) may provide a driving force that allows, via surface rearrangement and assembly reactions, self-planarization of the deposited film. Thus, in some embodiments, an ultra-smooth PECVD film that is deposited on a comparatively rougher film may still exhibit ultra-smooth characteristics. This may provide a highly smooth surface for a film stack, even if the film stack comprises comparatively rougher underlying films.

Figures 6, 7:
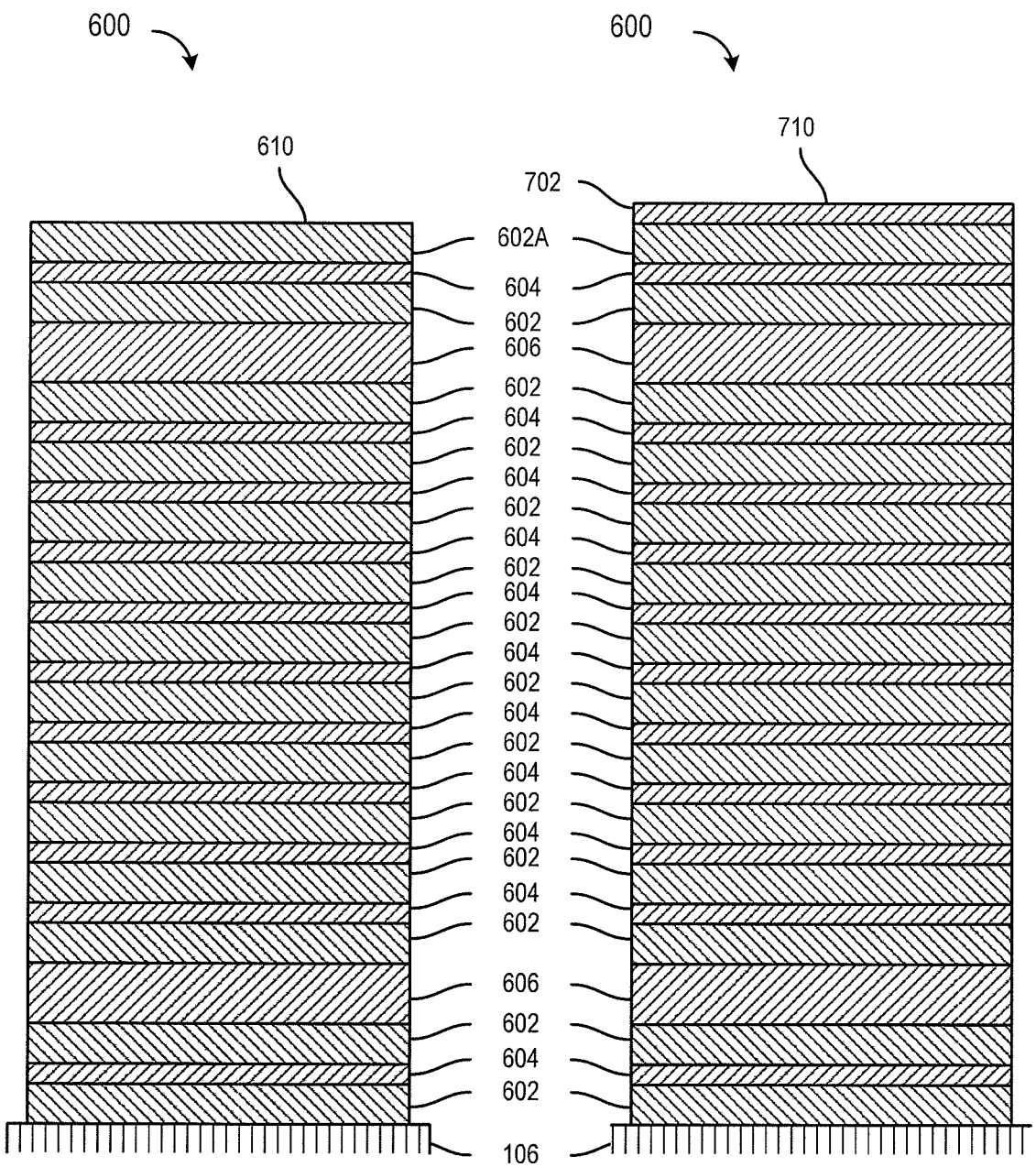
FIG. 6 schematically shows an embodiment of a film stack including example ultra-smooth PECVD $SiO_2$ films deposited according to an embodiment of the present disclosure, the ultra-smooth PECVD $SiO_2$ films interleaved with silicon nitride films.
FIG. 7 schematically shows an ultra-smooth PECVD $SiO_2$ film deposited according to an embodiment of the present disclosure deposited on top of the film stack schematically depicted in FIG. 6.

For example, FIG. 6 schematically shows an embodiment of a film stack 600 including example ultra-smooth PECVD $SiO_2$ films having a deposition rate of approximately 2.3 Å/sec. The example shown in FIG. 6 includes a plurality of 300 Å ultra-smooth PECVD $SiO_2$ films 604 interleaved with a plurality of 800 Å silicon nitride films 602 and a plurality of 1000 Å ultra-smooth PECVD $SiO_2$ films 606. A final 800 Å silicon nitride film (layer 602A) having a top surface 610 is deposited on top of film stack 600. FIG. 7 schematically shows a top layer of ultra-smooth PECVD $SiO_2$ film (layer 702) deposited on top of film stack 600.

Figure 8:
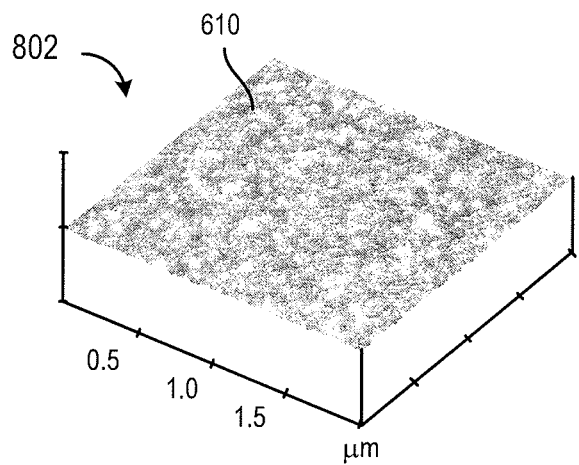
FIG. 8 shows an AFM image of a silicon nitride surface exposed at the top of the film stack schematically depicted in FIG. 6.

FIG. 8 shows an AFM image 800 of silicon nitride surface 610 exposed at the top of film stack 600 schematically depicted in FIG. 6. As measured by AFM, silicon nitride surface 610 exhibits an absolute roughness of approximately 6.9 Å. For comparative purposes, an 800 Å silicon nitride film deposited on a film stack having an identical number of alternating layers of silicon dioxide and silicon nitride in which conventional TEOS-based PECVD $SiO_2$ films are substituted for ultra-smooth PECVD $SiO_2$ films has an absolute roughness of approximately 10 Å. Thus, the ultra-smooth PECVD $SiO_2$ film yields a comparatively smoother surface at the top of an overlying silicon nitride relative to a TEOS-based PECVD $SiO_2$ film.

Figure 9:
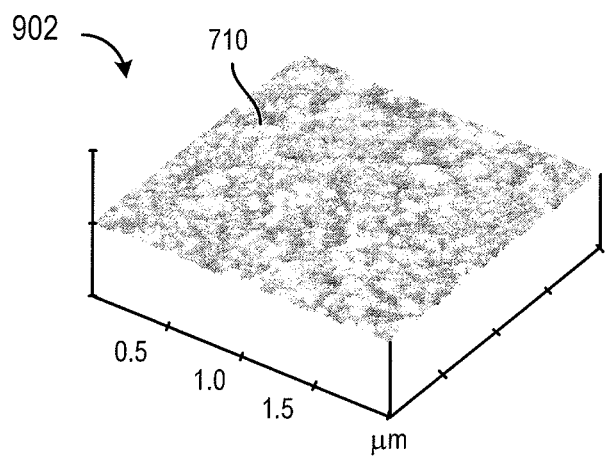
FIG. 9 shows an AFM image of a surface of a 300 Å-ultra-smooth PECVD $SiO_2$ film deposited according to an embodiment of the present disclosure at the top of the film stack schematically depicted in FIG. 7.
Figure 10:
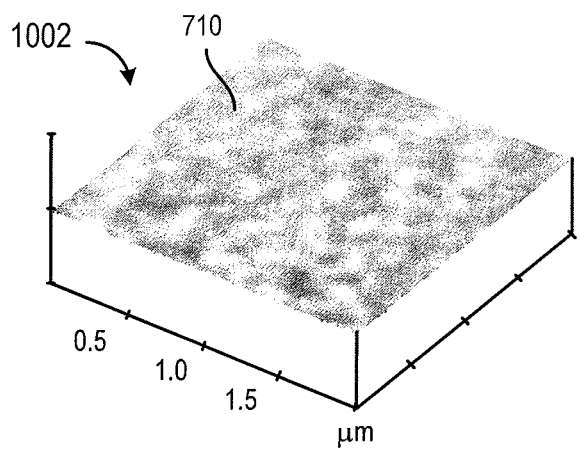
FIG. 10 shows an AFM image of a surface of a 3000 Å-ultra-smooth PECVD $SiO_2$ film deposited according to an embodiment of the present disclosure at the top of the film stack schematically depicted in FIG. 7.

Subsequent deposition of ultra-smooth PECVD $SiO_2$ film layer on top of the silicon nitride layer may provide additional improvement in top surface roughness relative to the silicon nitride layer roughness. For example, FIGS. 9 and 10 show AFM images 900 and 1000, respectively, of top surface 710 of ultra-smooth PECVD $SiO_2$ film layer 702 schematically depicted in FIG. 7. As measured by AFM, ultra-smooth PECVD $SiO_2$ top surface 710 has an absolute roughness of approximately 5.4 Å when layer 702 is deposited at a 300 Å thickness (as shown in FIG. 9), having a roughness approximately 80% of that exhibited by the underlying silicon nitride film. Further, comparatively thicker layers of ultra-smooth PECVD $SiO_2$ films may provide comparatively smoother top surfaces. For example, when layer 702 is deposited at a 3000 Å thickness (as shown in FIG. 10), it exhibits an absolute roughness of approximately 3.6 Å, having a roughness approximately 50% of that exhibited by the underlying silicon nitride film. In contrast, when conventional TEOS-based PECVD $SiO_2$ films are substituted for ultra-smooth PECVD $SiO_2$ films, there is no reduction in the surface roughness compared that exhibited by the silicon nitride film. Specifically, each of a 300 Å-thick and a 3000 Å-thick TEOS-based PECVD $SiO_2$ film exhibits an absolute roughness of approximately 10 Å.

Figure 11:
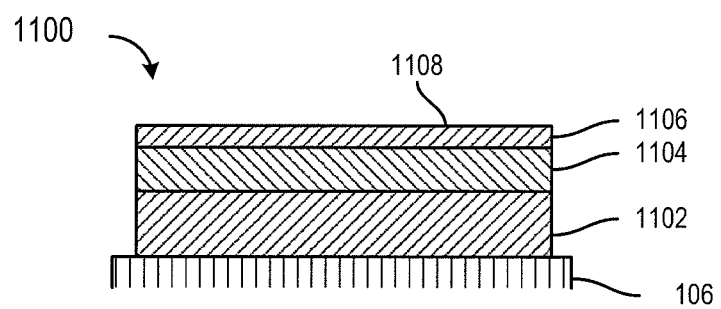
FIG. 11 schematically shows another embodiment of a film stack including example ultra-smooth PECVD $SiO_2$ films deposited according to an embodiment of the present disclosure, the ultra-smooth PECVD $SiO_2$ films interleaved with silicon nitride films.
Figure 12:
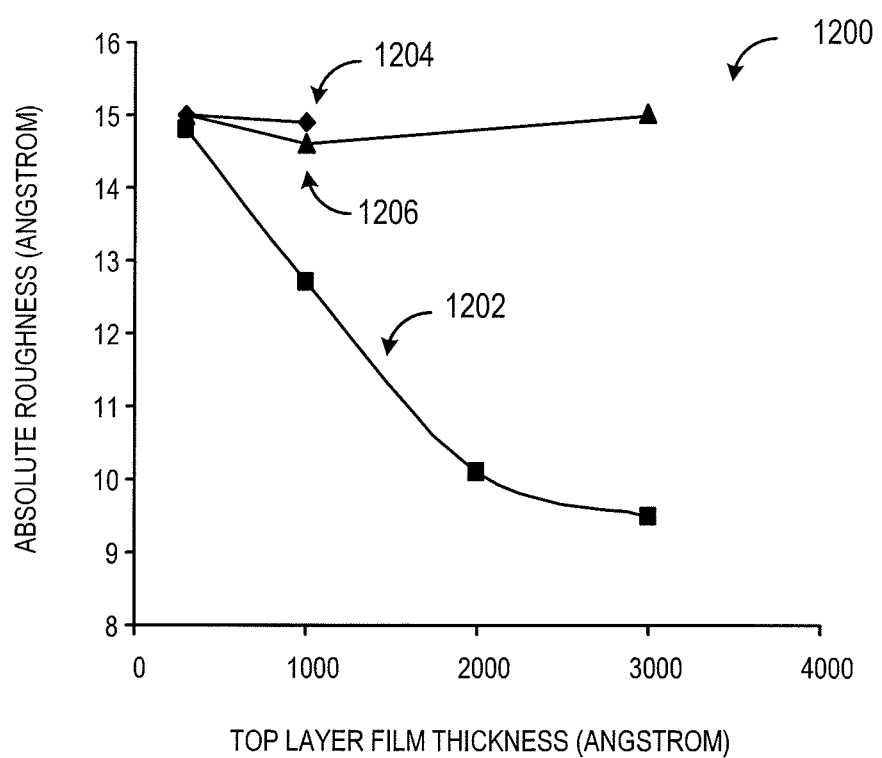
FIG. 12 graphically shows an example relationship between the thickness of ultra-smooth PECVD $SiO_2$ films deposited according to an embodiment of the present disclosure, conventional TEOS-based PECVD $SiO_2$ films, and conventional silane-based PECVD $SiO_2$ films and absolute roughness measurements for those films.

As described above, in some embodiments, ultra-smooth PECVD films may exhibit a decreasing surface roughness as the thickness of the ultra-smooth PECVD film increases. FIGS. 11 and 12 illustrate another example of such an embodiment. FIG. 11 schematically shows an example of a film stack 1100 including a 1000 Å-thick conventional silane-based PECVD $SiO_2$ film layer 1102 deposited on substrate 106. An 800 Å-thick silicon nitride layer 1104 is deposited on top of layer 1102. For reference, the roughness of layer 1104 is approximately 16.3 Å Ra. FIG. 11 also shows a top surface 1108 of an example ultra-smooth PECVD $SiO_2$ film layer 1106, layer 1106 being deposited on top of layer 1104. FIG. 12 shows a graph 1200 illustrating an example relationship 1202 between the thickness of layer 1106 and the roughness of surface 1108 for an example ultra-smooth PECVD $SiO_2$ film deposited at approximately 2.3 Å/sec. As shown in FIG. 12, the ultra-smooth PECVD $SiO_2$ film exhibits an inverse relationship between thickness and surface roughness for ultra-smooth PECVD $SiO_2$ film thickness up to approximately 3000 Å. For comparison purposes, curves 1204 and 1206 do not depict an inverse relationship between thickness and surface roughness data for the conventional silane-based and TEOS-based PECVD processes. When viewed in the light of the direct relationship between thickness and roughness exhibited by the conventional PECVD films individually (shown in FIG. 5), the data shown in FIG. 12 suggests that, unlike conventional PECVD films, increasing the thickness of some example ultra-smooth PECVD films may comparatively improve the surface of a film stack relative to the surface roughness of an underlying film.

Figure 13:
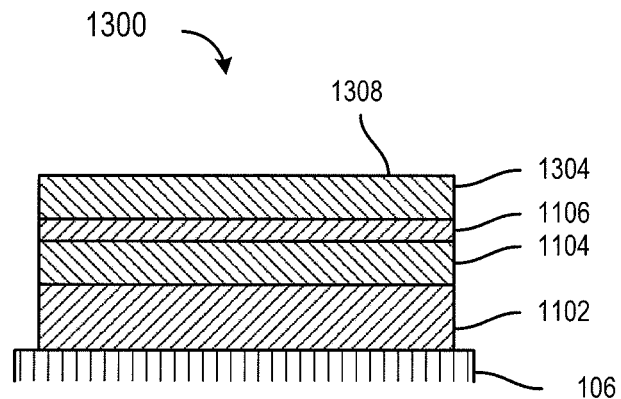
FIG. 13 schematically shows a silicon nitride film deposited on top of the film stack schematically depicted in FIG. 11.
Figure 14:
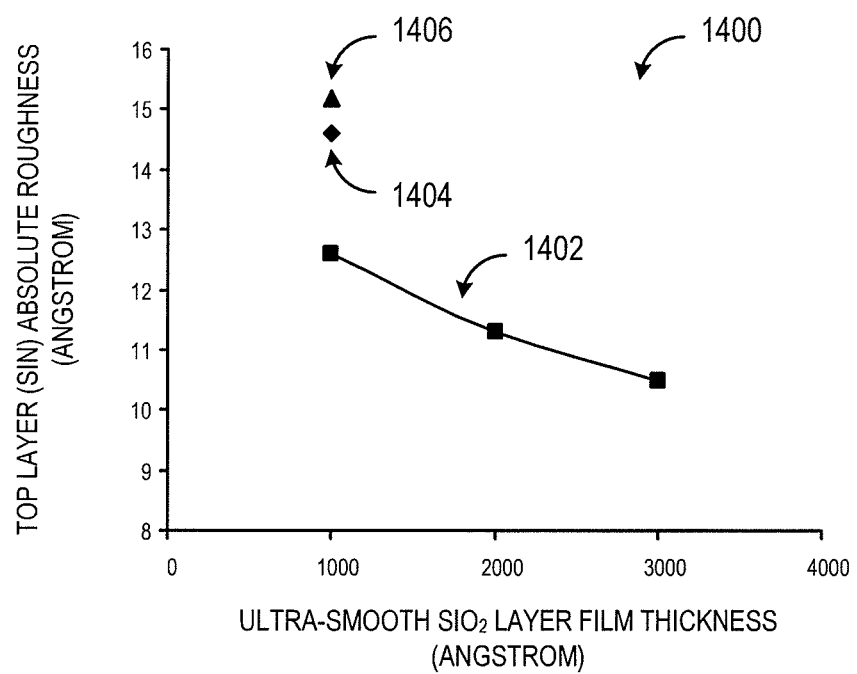
FIG. 14 graphically shows an example relationship between the thickness of ultra-smooth PECVD $SiO_2$ films deposited according to an embodiment of the present disclosure, conventional TEOS-based PECVD $SiO_2$ films, and conventional silane-based PECVD $SiO_2$ films and absolute roughness measurements for an 800 Å-silicon nitride film deposited on each of those $SiO_2$ films.

In some embodiments, increasing the thickness of an ultra-smooth PECVD film may decrease the roughness of a film deposited on top of the ultra-smooth PECVD film, as shown in the examples depicted in FIGS. 13 and 14. FIG. 13 schematically shows film stack 1100 of FIG. 11, including example ultra-smooth PECVD $SiO_2$ film layer 1106, on top of which an 800 Å-thick silicon nitride layer 1304 is deposited. FIG. 14 shows a graph 1400 illustrating an inverse relationship 1402 between the thickness of layer 1106 and the roughness of surface 1308 of silicon nitride layer 1304. For example, for a 1000 Å thick ultra-smooth PECVD $SiO_2$ film layer 1106 underlying silicon nitride layer 1304, silicon nitride surface 1308 exhibits an absolute roughness of approximately 12.6 Å, or approximately 77% as rough as silicon nitride layer 1104 and approximately the same roughness as ultra-smooth PECVD $SiO_2$ film layer 1106. For comparison, points 1404 and 1406 depict thickness-dependent roughness data for the conventional silane-based and TEOS-based PECVD processes, respectively, which are approximately 92% and 89% as rough as layer 1304.

Figure 15:
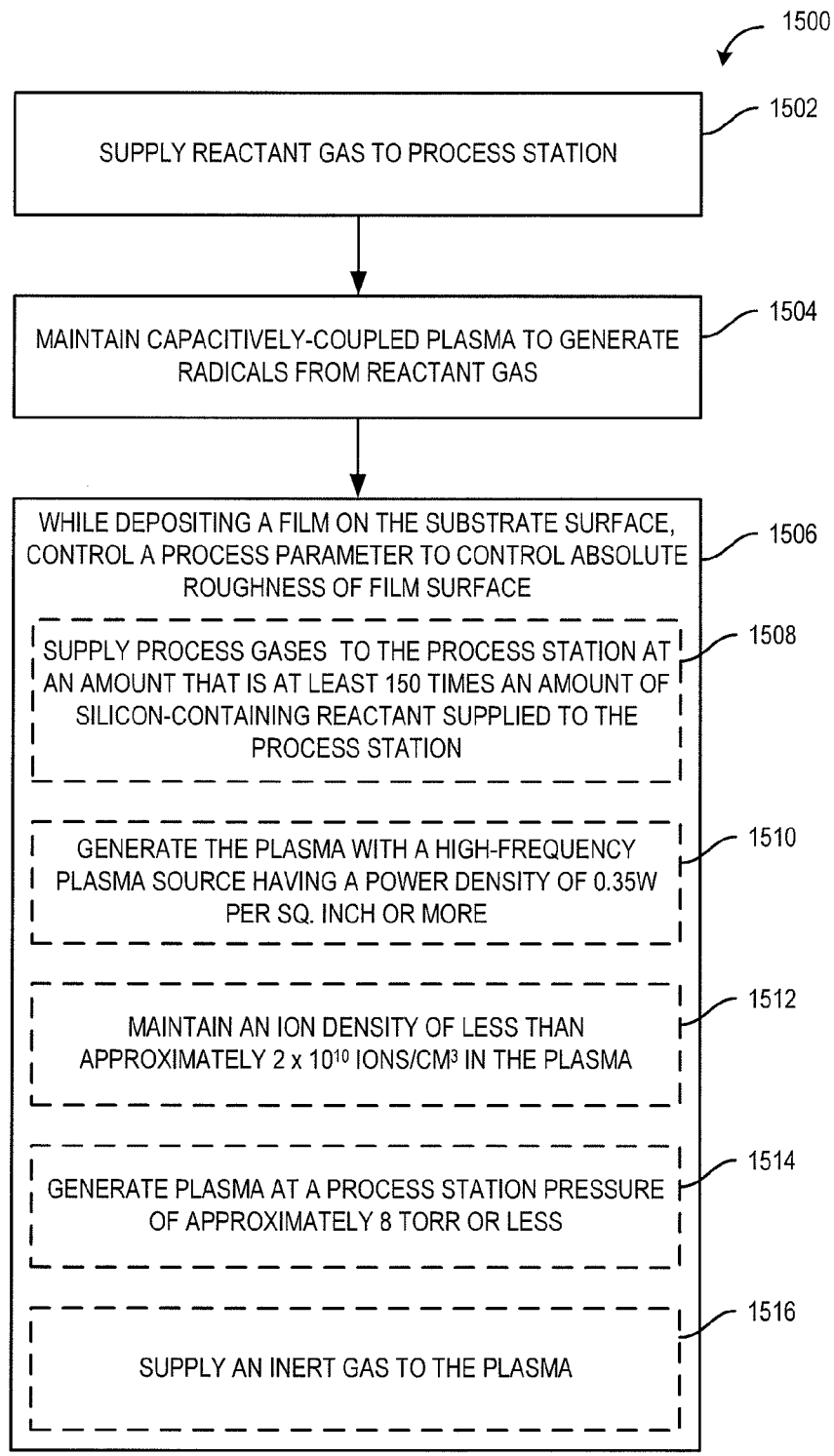
FIG. 15 shows a flow chart illustrating a method of depositing an ultra-smooth PECVD silicon-containing film according to an embodiment of the present disclosure.

FIG. 15 shows a flow chart illustrating an example embodiment of a method 1500 for depositing an ultra-smooth PECVD silicon-containing film. Method 1500 includes, at 1502, supplying a reactant gas or reactant gas mixture to a process station. At 1504, method 1500 includes maintaining a capacitively-coupled plasma to generate radicals and active species of the reactant gas and/or of inert gases included in the reactant gas mixture. At 1506, method 1500 includes, while depositing a film on the substrate surface, controlling a process parameter to control an absolute roughness of the film surface, as explained in more detail below. For example, in some embodiments, one or more process parameters may be controlled during a film deposition phase so that the absolute roughness of the film decreases with increasing thickness of the film. In another example, in some embodiments, one or more process parameters may be controlled during a film deposition phase so that the absolute roughness is controlled to below a predetermined threshold. In one scenario, for example, the absolute roughness of an ultra-smooth PECVD silicon-containing film having a refractive index of between approximately 1.4 and 2.1 may be controlled to below 4.5 Å as measured on a bare silicon substrate. It will be appreciated that process parameter control may be performed by any suitable controller included in a process tool. Example controllers are described in more detail below.

While method 1500 refers to a method of depositing a single layer of ultra-smooth PECVD film, it will be appreciated that, in some embodiments, method 1500 may represent an ultra-smooth PECVD film deposition phase of an in-situ film stack deposition process. Thus, in some embodiments, a suitable number of instances of method 1500 may be performed to build a film stack. In one example, layers of ultra-smooth PECVD undoped silicon films (discussed in more detail below) may be alternated with layers of ultra-smooth PECVD doped silicon films to build an ultra-smooth alternating undoped silicon/doped silicon film stack. In another example, layers of ultra-smooth PECVD undoped silicon films may be alternated with layers of ultra-smooth PECVD silicon dioxide films. Thus, in some embodiments, suitable ultra-smooth PECVD processes may be used to deposit each layer in a film stack. In one scenario, for example, layers of ultra-smooth silicon oxide may be alternated with layers of ultra-smooth silicon nitride. In another scenario, layers of ultra-smooth silicon oxide may be alternated with layers of conventional silicon nitride film.

Alternatively, in other embodiments, a suitable number of instances of method 1500 may be included, at one or more suitable intervals, with other suitable deposition processes (e.g., PECVD, CVD, or ALD processes) to build a film stack in-situ. In one example, an ultra-smooth PECVD silicon dioxide film may be alternated with a PECVD silicon nitride film to form an alternating silicon dioxide/silicon nitride film stack similar to that shown in FIG. 4. In another example, a conventionally-deposited film stack may be capped with a suitable thickness of an ultra-smooth PECVD film.

Further, it will be appreciated that, in some embodiments, adjusting the film stack deposition scheme may provide, on an in-situ basis, approaches to tune bulk properties of the film stack (e.g., wafer bow) while still providing an acceptable top surface roughness, and, in some embodiments, to provide ultra-smooth patterning surfaces while realizing faster deposition rates for underlying layers.

Continuing with FIG. 15, various examples of approaches to control one or more process parameters to control an absolute roughness of the film surface are described below with respect to an example ultra-smooth PECVD silicon dioxide film process. For example, an ultra-smooth silicon dioxide film may be deposited using silane and nitrous oxide ($N_2O$) in one or more process stations of a process tool. Non-limiting examples of process conditions for depositing ultra-smooth PECVD silicon dioxide films using an example four-station process tool (an embodiment of which is described in more detail below) are provided in Table 1.

TABLE 1

| Parameter | Range |
|---|---|
| Pressure (torr) | 0.5-8.0 |
| Temperature (° C.) | 300-600 |
| He flow rate (sccm) | 0-10000 |
| Ar flow rate (sccm) | 0-10000 |
| Silane flow rate (sccm) | 10-200 |
| $N_2O$ flow rate (sccm) | 1000-30000 |
| Nitrogen flow rate (sccm) | 0-20000 |
| High-frequency plasma power (W) | 500-5000 |
| Low-frequency plasma power (W) | 0-2500 |
| Time between beginning of silane flow and plasma ignition (sec) | −3 to +3 |
| Time between end of silane flow and plasma extinction (sec) | −3 to 10 |

In some embodiments, controlling a process parameter to control an absolute roughness of the film surface may include, at 1508, supplying process gases to the process station at an amount that is at least 150 an amount of silicon-containing reactant fed to the process station. For example, one or more co-reactants and/or one or more diluents may be supplied to the process station at a concentration of at least 150 times a concentration of a silicon-containing reactant. In such embodiments, oversupplying the co-reactant may create a plasma that is lean in silicon radicals, potentially reducing the deposition rate. By controlling the deposition rate to less than a threshold deposition rate, an ultra-smooth PECVD film may result.

For example, in the case of a silicon oxide film deposited using the example process parameters described above, $N_2O$ may be fed at a flow rate of from approximately 5 times an amount of the silane flow rate to approximately 3000 times an amount of the silane flow rate. Assuming other process parameters are held constant, the greater flow rate of $N_2O$ may control the deposition rate of the silicon dioxide film to less than 10 Å/sec. Such deposition rates may have surface rearrangement and assembly reactions at suitable rates to produce an ultra-smooth silicon oxide film having a roughness of less than or equal to 4.5 Å Ra for films of up to 3000 Å thickness or more as measured on a silicon substrate.

Figure 16:
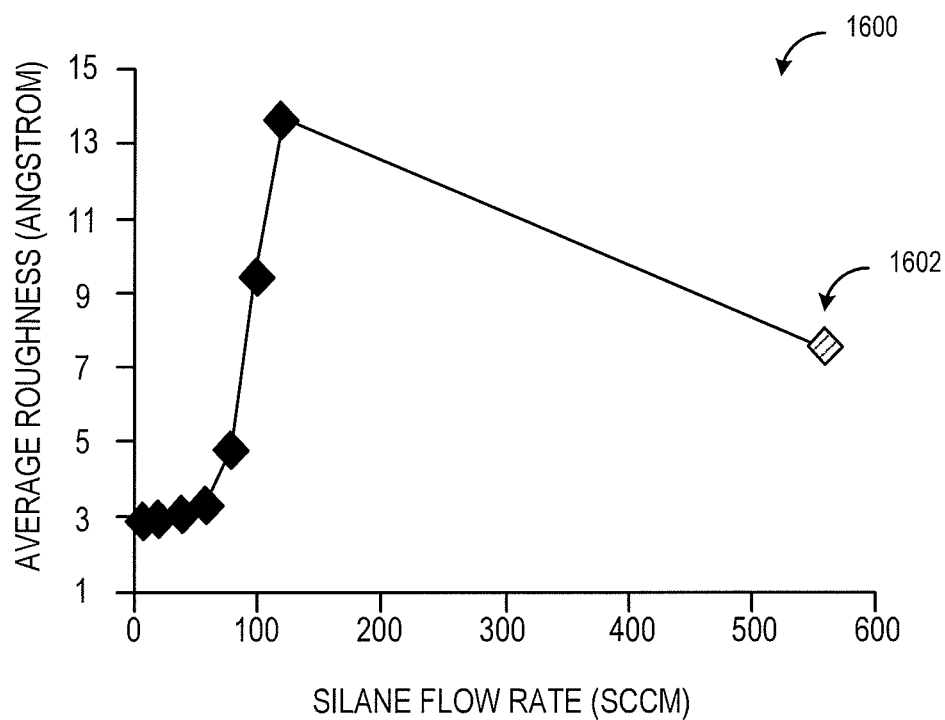
FIG. 16 graphically shows an example relationship between surface roughness and silane flow rate for conventional PECVD $SiO_2$ films and ultra-smooth PECVD $SiO_2$ films deposited according to embodiments of the present disclosure.
Figure 17:
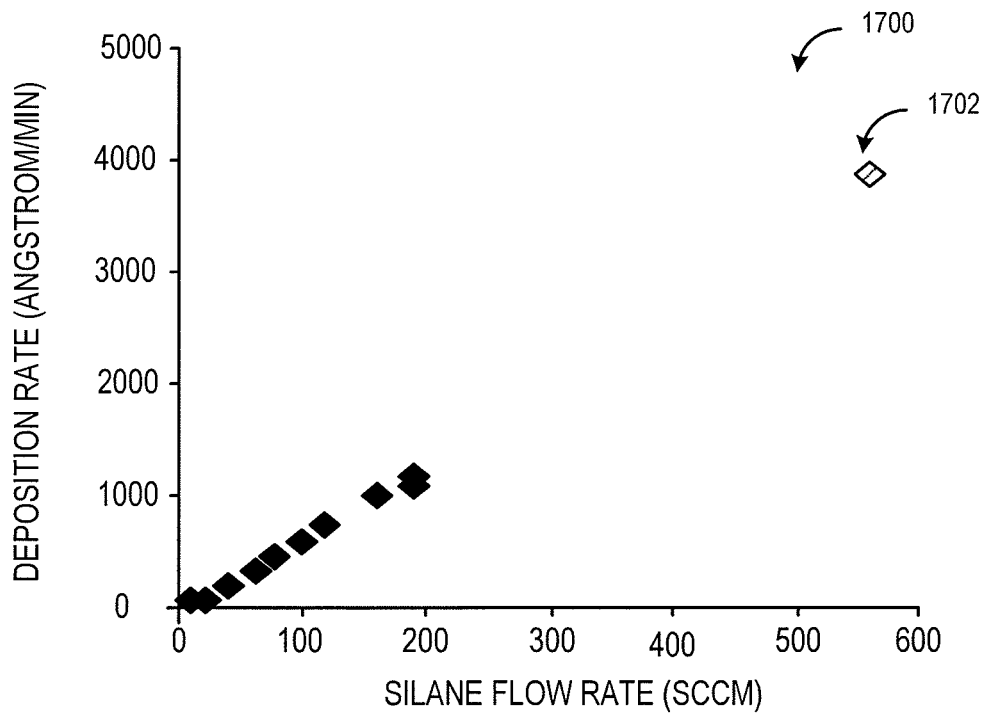
FIG. 17 graphically shows an example relationship between silane flow rate and $SiO_2$ film deposition rate for the example films shown in FIG. 7.

Previously, it was believed that reducing the flow rate of silane in conventional silane-based PECVD silicon dioxide deposition processes would not result in a similar reduction in silicon dioxide film roughness. Instead, the surface of the deposited film was believed to become rougher as the silane flow rate was reduced. FIG. 16 shows an example relationship 1600 between surface roughness as measured by AFM and silane flow rate. FIG. 17 shows an example relationship 1700 between silane flow rate and silicon dioxide film deposition rate for relationship 1600 shown in FIG. 16. For comparative purposes, an example film deposited by the conventional silane-based PECVD process is indicated (points 1602 and 1702). FIGS. 16 and 17 graphically illustrate that roughness increases as the silane flow rate and the deposition rate decrease from the conventional silane-based PECVD process.

However, referring to the left-most portion of FIG. 16, it has been found that controlling the deposition rate below a threshold level may actually decrease surface roughness, which may allow ultra-smooth silicon-containing surfaces to be obtained. Thus, FIGS. 16 and 17 show that, in the embodiment depicted, reducing the flow rate of silane below 100 sccm reduces the silicon dioxide deposition rate to below 10 Å/sec, in turn reducing the surface roughness of the silicon dioxide film deposited. As shown in FIGS. 16 and 17, in some embodiments, processes providing a silicon dioxide deposition rate of less than 6 Å/sec may produce films having a roughness of less than or equal to 4.5 Å Ra for films of up to 3000 Å thickness or more as measured on a silicon substrate.

While the example described above refers to controlling the deposition rate by controlling a flow and/or concentration of silane, it will be appreciated that such effects may be achieved by controlling the flow and/or concentration of any suitable silicon-containing reactant. Non-limiting examples of suitable silicon-containing reactants that may produce ultra-smooth silicon-containing films include silanes (e.g., $Si_xH_y$, such as silane and disilane), halogen-substituted silanes (e.g., $Si_xCl_y$), and alkyl-substituted silanes (e.g., $Si_xR_y$).

Figure 18:
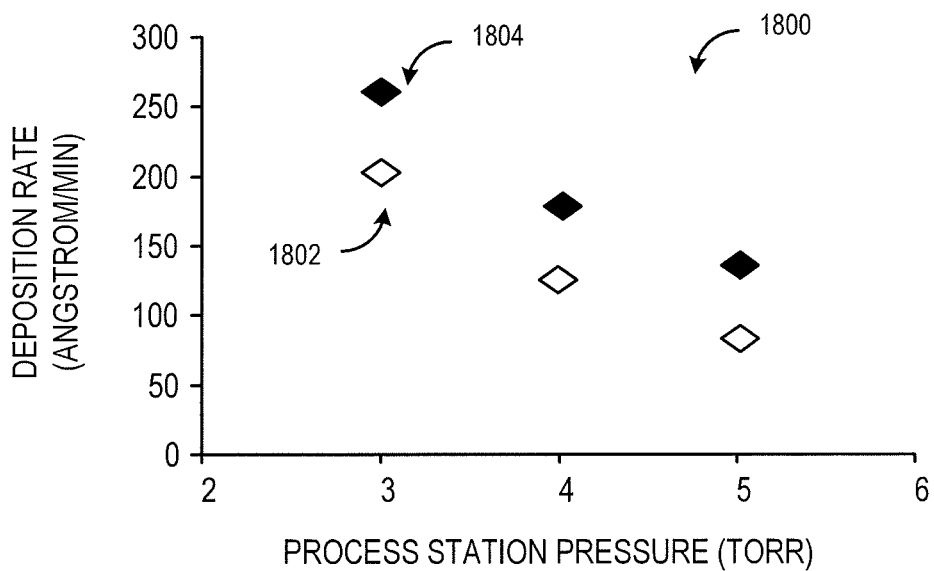
FIG. 18 graphically shows relationships between process station pressure and $SiO_2$ film deposition rates for ultra-smooth PECVD $SiO_2$ films deposited according to embodiments of the present disclosure, the $SiO_2$ films being deposited from ultra-smooth PECVD processes having similar silane flow rates but different total gas flow rates.

It will be appreciated that, in some embodiments, controlling the flows and/or concentrations of other process gases (e.g., co-reactants, such as $N_2O$, CO, and $CO_2$, and inerts, such as nitrogen, argon, and helium) may be used to control the deposition rate of the film to less than a threshold amount. For example, FIG. 18 shows a relationship 1800 between process station pressure and deposition rate for example ultra-smooth PECVD $SiO_2$ films deposited at a constant 100% $SiH_4$ flow rate of 40 sccm (though it will be appreciated that suitably dilute silane feed sources may have a greater flow rate without departing from the scope of the present disclosure) but having different total gas flow rates. Specifically, points 1802 shows a deposition rate trend for an example where the flow rates of all gases except silane are half the corresponding flow rates for the example shown in points 1804. Despite effectively increasing the concentration of silane, in the example shown in FIG. 18, reducing the flow rate of inert and non-inert gases leads to a decrease in deposition rate and a reduction in film roughness of up to 0.3 Å Ra (not shown) from the conditions of points 1804 to the conditions of points 1802. In another example, substituting CO or $CO_2$ for $N_2O$, each of which may have a different ionization cross-section relative to $N_2O$, may reduce the concentration of oxygen radicals in the plasma, potentially reducing the deposition rate of the silicon dioxide film.

As explained above, in some embodiments, and without wishing to be bound by theory, it is believed that decreasing the silane flow may provide additional time for surface migration and cross-linking of various silane radical species. Increasing the time for such processes may provide structurally dense lattices with comparatively fewer defects, potentially resulting in a smoother surface topography.

Figure 19:
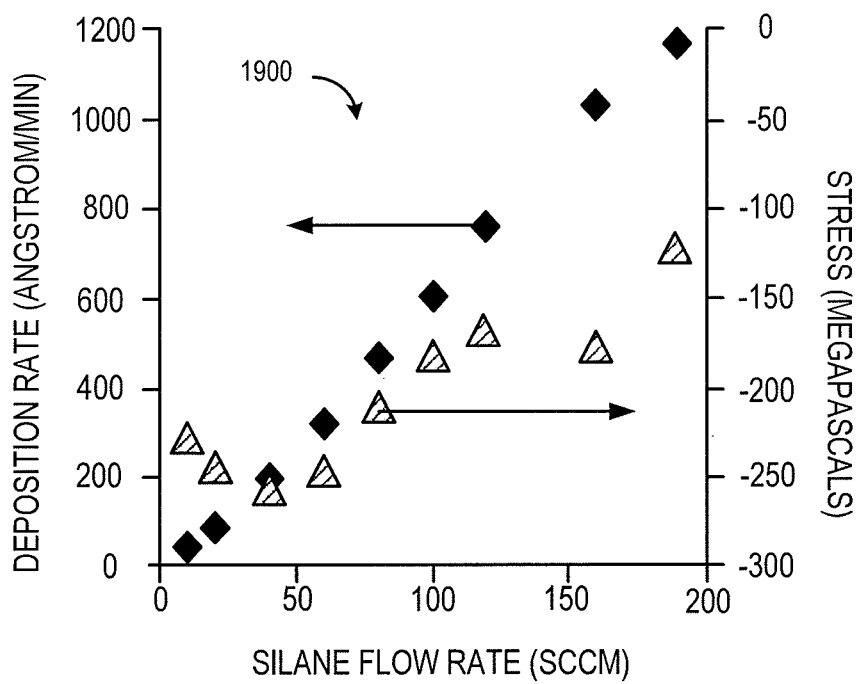
FIG. 19 graphically shows a relationship between film stress, $SiO_2$ film deposition rate, and silane flow rate for ultra-smooth PECVD $SiO_2$ films deposited according to embodiments of the present disclosure.
Figure 20:
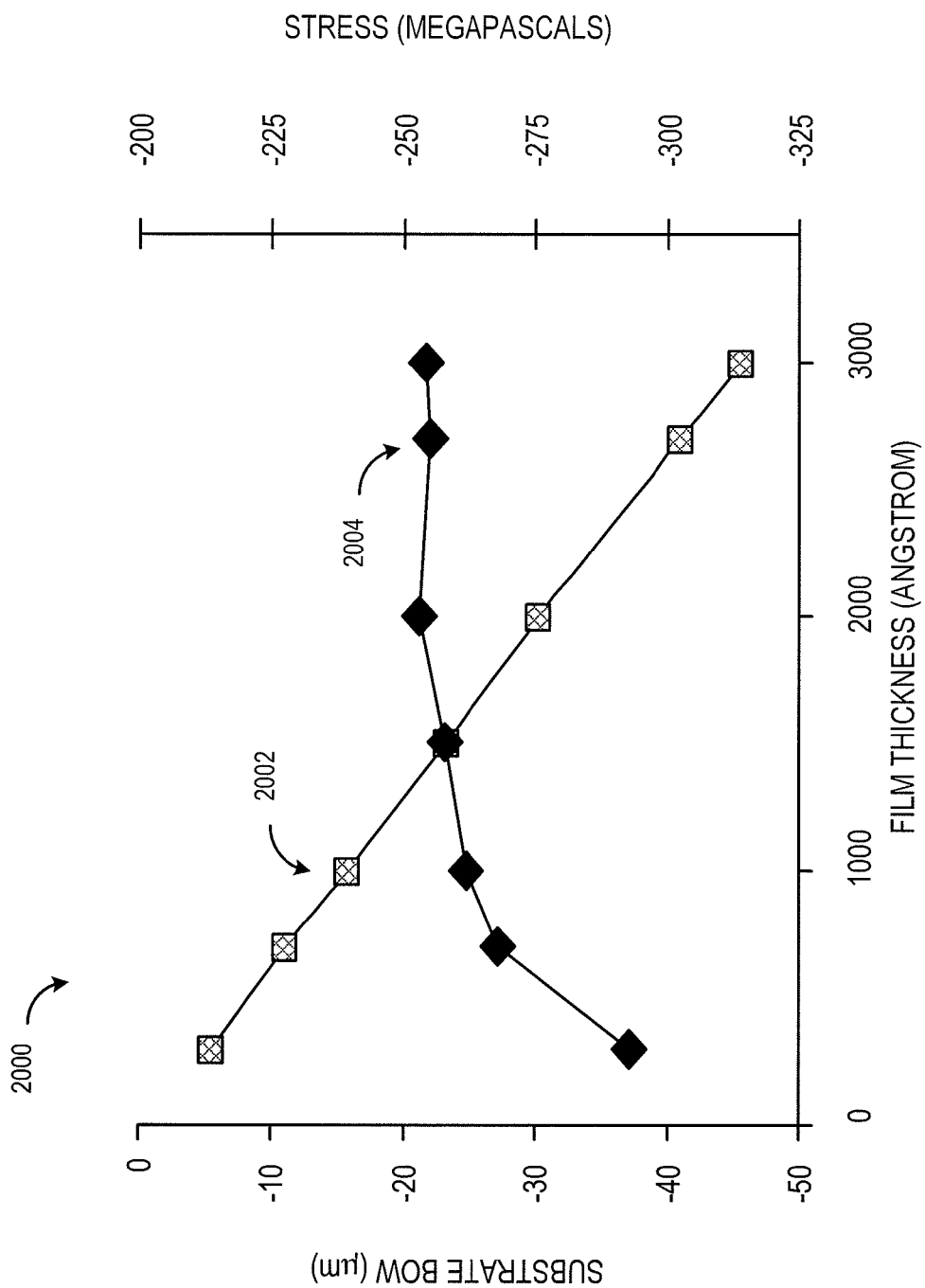
FIG. 20 graphically shows relationships between film stress, substrate bow, and film thickness for an ultra-smooth PECVD $SiO_2$ film deposited according to an embodiment of the present disclosure.

For example, FIG. 19 illustrates a relationship 1900 between film stress, deposition rate, and silane flow rate for an example silicon dioxide film. As the deposition rate declines in the example shown in FIG. 19, the film stress becomes comparatively more compressive, suggesting that the film is structurally denser. FIG. 20 shows a relationship 2000 between film stress, substrate bow, and film thickness for an example ultra-smooth PECVD $SiO_2$ film deposited at approximately 2.3 Å/sec. The example film shown in FIG. 20 exhibits a linear dependence 2002 of substrate bow on film thickness. The example film shown in FIG. 20 also exhibits a non-linear relationship 2004 between film stress and film thickness. As shown in FIG. 20, the film stress for the example film rapidly approaches the bulk film stress level within the first 1000 Å of deposition. Thus, the example ultra-smooth PECVD silicon dioxide film shown in FIG. 20 may rapidly achieve structural stability as the film is deposited.

Figure 21:
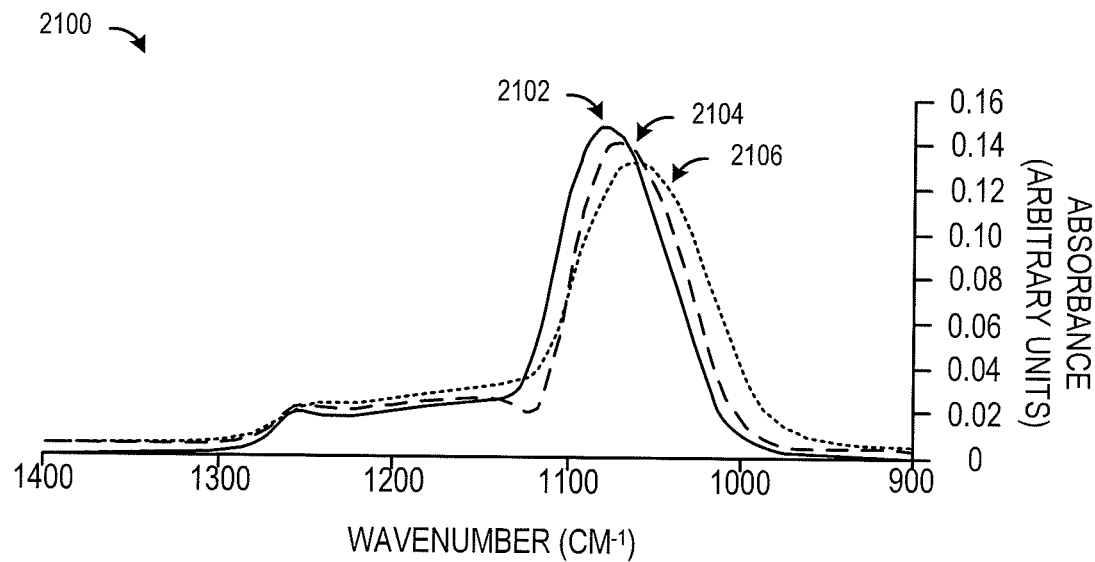
FIG. 21 graphically shows a comparison of Fourier transform infrared spectra showing Si—O bond-stretching mode data for a thermally-grown $SiO_2$ film, a TEOS-based PECVD $SiO_2$ film, and an ultra-smooth PECVD $SiO_2$ film deposited according to an embodiment of the present disclosure.

Other structural analyses provide additional support for the suggestion that increasing the time for surface rearrangement and assembly reactions may provide structurally dense lattices with comparatively fewer defects, potentially resulting in a smoother surface topography. For example, FIG. 21 shows a comparison of Fourier transform infrared (FTIR) spectra for an example thermally grown $SiO_2$ film (spectrum 2102) (sometimes called thermal oxide), an example ultra-smooth PECVD $SiO_2$ film having a deposition rate of approximately 2.3 Å/sec (spectrum 2104), and an example conventional TEOS-based PECVD $SiO_2$ film (spectrum 2106). As shown in FIG. 21, the example ultra-smooth PECVD film has a structure and composition that is more like that of the thermal oxide than the TEOS-based film is like that of the thermal oxide. For example, the peak height of the Si—O bond stretch mode for an example ultra-smooth PECVD film is higher and narrower than the peak height of the Si—O bond stretch mode for the TEOS-based film for comparable film thicknesses. This may suggest that there is a comparatively narrower distribution of bond types within the example ultra-smooth PECVD film relative to the TEOS-based film. Further, the position of the Si—O bond stretch mode for the ultra-smooth PECVD film shown in FIG. 21 (1071 cm$^{-1}$) is closer to the Si—O bond stretch mode position for the thermal oxide (1078 cm$^{-1}$) than is the Si—O bond stretch mode for the TEOS-based film (1063 cm$^{-1}$).

As further support for the suggestion that increasing the time for surface rearrangement and assembly reactions may provide structurally dense lattices with comparatively fewer defects, potentially resulting in a smoother surface topography, the wet etch characteristics of some ultra-smooth PECVD $SiO_2$ films approaches those of thermal oxides. Table 2 includes wet etch rate ratio (WERR, defined as 1 for thermal oxide) data for various PECVD $SiO_2$ films in a dilute hydrofluoric acid bath (100:1 $H_2O$:HF). For comparison, WERR data for conventional silane-based and TEOS-based PECVD processes and for a conventional HDP-CVD process are also included in Table 2. As shown in Table 2, the WERR for several ultra-smooth PECVD $SiO_2$ films is between 1.2 and 2.0.

TABLE 2

| Film Process | Deposition Rate | WERR |
|---|---|---|
| Ultra-smooth PECVD | 2.3 Å/sec | 1.2 |
| Ultra-smooth PECVD | 6.1 Å/sec | 2.0 |
| Conventional TEOS-Based PECVD | — | 1.7 |
| Conventional silane-based PECVD | — | 4.0 |
| Conventional HDP-CVD | — | 1.4 |
| Thermally grown oxide | — | 1.0 |

Returning to FIG. 15, in some embodiments, controlling a process parameter to control an absolute roughness of the film surface may include, at 1510, generating the plasma with a power density of 0.35 W/in$^2$ or more. In some embodiments, such power densities may be generated by a high-frequency plasma source operated at 250 W or more. As used herein, "high-frequency plasma" refers to a plasma operated at a frequency of 13.56 MHz or more. Additionally or alternatively, in some embodiments, a low frequency (e.g., frequencies below 13.56 MHz) power source may be used. In some other embodiments, a dual-frequency plasma may be used.

Table 3 provides example silicon dioxide film deposition and topography data for a plurality of ultra-smooth PECVD $SiO_2$ films deposited at 550° C. using various high-frequency (HF) plasma powers on silicon substrates. While the example described herein refers to a high-frequency plasma, it will be appreciated that any suitable plasma and/or power may be employed without departing from the scope of the present disclosure.

TABLE 3

| HF Power (W) | 100% $SiH_4$ flow (sccm) | $SiO_2$ Thickness (Å) | Dep. Rate (Å/sec) | Stress (MPa) | Ra (nm) |
|---|---|---|---|---|---|
| 1000 | 40 | 1031 | 3.26 | −254 | 0.304 |
| 1500 | 40 | 1019 | 2.76 | −258 | 0.278 |
| 2000 | 40 | 1024 | 2.49 | −268 | 0.275 |
| 2500 | 40 | 1030 | 2.34 | −268 | 0.263 |
| 3000 | 40 | 1023 | 2.24 | −265 | 0.256 |

TABLE 3-continued

| HF Power (W) | 100% SiH₄ flow (sccm) | SiO₂ Thickness (Å) | Dep. Rate (Å/sec) | Stress (MPa) | Ra (nm) |
|---|---|---|---|---|---|
| 3500 | 40 | 1034 | 2.20 | −267 | 0.252 |
| 4000 | 40 | 1015 | 2.19 | −249 | 0.245 |
| 4500 | 40 | 1025 | 2.27 | −267 | 0.245 |

Figure 22:
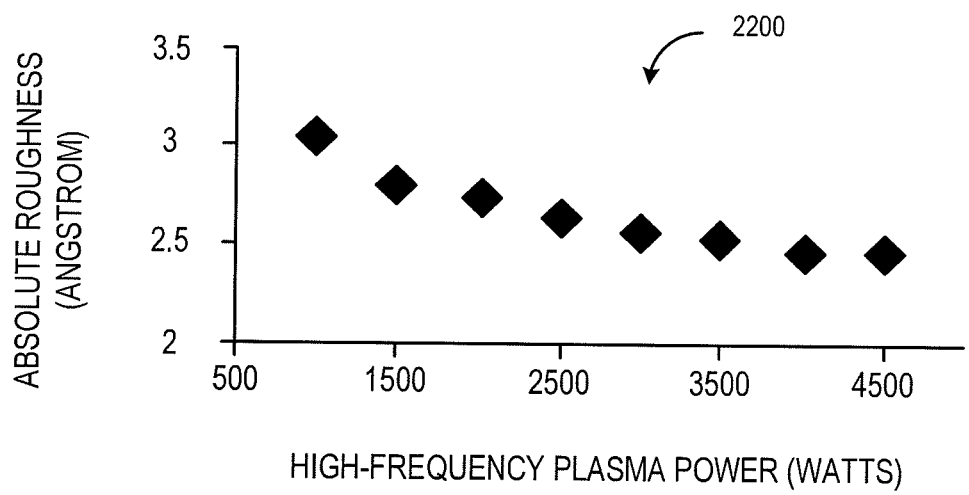
FIG. 22 graphically shows a relationship between absolute roughness of ultra-smooth PECVD $SiO_2$ films deposited according to embodiments of the present disclosure and the power level of a high-frequency plasma.

FIG. 22 graphically illustrates a relationship 2200 between high-frequency plasma power and absolute roughness for the example ultra-smooth PECVD silicon dioxide films provided in Table 3. As shown in FIG. 22, at low deposition rates, such as those corresponding to low silane flow rates, increasing the power of a high-frequency plasma may reduce the absolute roughness of ultra-smooth PECVD SiO₂ films. In the example shown in FIG. 22, the surface roughness of some ultra-smooth PECVD silicon dioxide films may be less than 2.5 Å as measured on a silicon substrate. As the native surface roughness of a typical silicon substrate approaches 2.5 Å, this may further suggest that such films are capable of self-planarization.

Additionally or alternatively, in some embodiments, the plasma conditions may be selected to control the ion density of the plasma. Continuing with FIG. 15, controlling a process parameter to control an absolute roughness of the film surface may include, at 1512, maintaining an ion density of less than $2 \times 10^{10}$ ions/cm³. For example, a plasma for depositing an ultra-smooth PECVD silicon oxide film may be supplied at a plasma power of between 250 and 5000 watts and at a process station pressure of between 0.5 and 8 torr. In some embodiments, such plasma powers may generate a plasma density of between approximately 0.35 W/in² and 7.1 W/in² at four 15-inch showerheads powered by a shared plasma generator. This may avoid potential sputter-induced interlayer mixing in film stack applications.

Continuing with FIG. 15, in some embodiments, controlling a process parameter to control an absolute roughness of the film surface may include, at 1514, generating a plasma at a process station pressure of approximately 8 torr or less. In such embodiments, an ultra-smooth characteristic may be substantially maintained while a deposition rate for a film is adjusted while maintaining the deposition rate at a rate below the threshold rate. Put another way, the deposition rate of the film may be adjusted by varying the process station pressure without substantially altering the ultra-smooth topography of a deposited film.

Thus, Table 4 shows example silicon dioxide film deposition and topography data for a plurality of ultra-smooth PECVD SiO₂ films deposited at 550° C. on silicon substrates using various process station pressures.

TABLE 4

| Pressure (torr) | SiH₄ flow (sccm) | HF Power (W) | Thickness (Å) | Dep. Rate (Å/sec) | Stress (MPa) | Ra (nm) |
|---|---|---|---|---|---|---|
| 1.5 | 40 | 2500 | 985.2 | 6.22 | −280 | 0.286 |
| 2 | 40 | 2500 | 978.5 | 5.66 | −285 | 0.277 |
| 3 | 40 | 2500 | 1006.6 | 3.91 | −286 | 0.263 |
| 4 | 40 | 2500 | 1018.4 | 2.84 | −271 | 0.256 |
| 5 | 40 | 2500 | 1042.9 | 2.36 | −268 | 0.271 |
| 6 | 40 | 2500 | 1030.9 | 2.11 | −267 | 0.261 |

Figure 23:
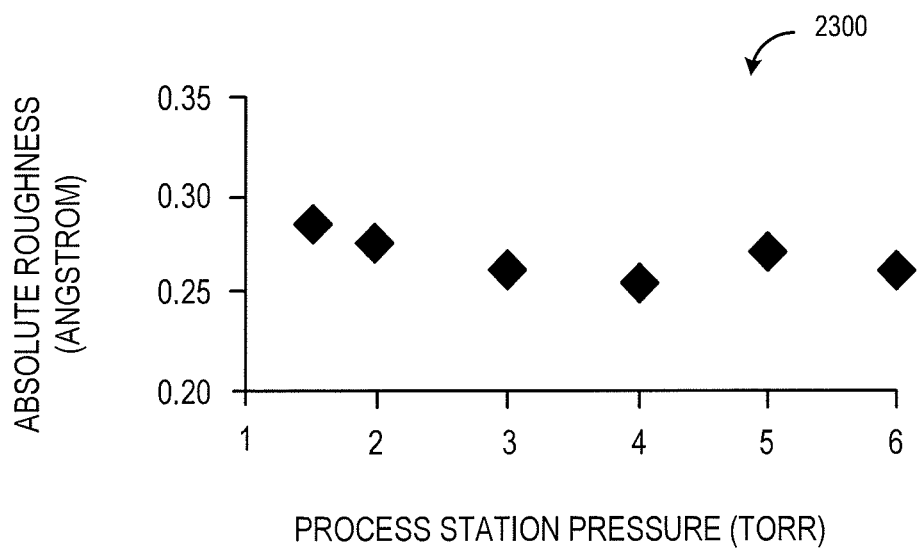
FIG. 23 graphically illustrates the dependence of process station pressure for ultra-smooth PECVD $SiO_2$ films deposited according to embodiments of the present disclosure and absolute roughness.

FIG. 23 illustrates a dependence 2300 of smoothness on process station pressure using the example data of Table 4. As shown in FIG. 23, decreasing the pressure of the process station may correlate with a slight increase in surface roughness for the example ultra-smooth PECVD silicon dioxide films, though the absolute roughness may still be maintained at less than 3 Å Ra as measured on a silicon substrate. FIG. 23 shows that surface smoothness may have a non-linear relationship with process station pressure during the example process range depicted, as shown in a minimum surface roughness at approximately 4 torr.

Figure 24:
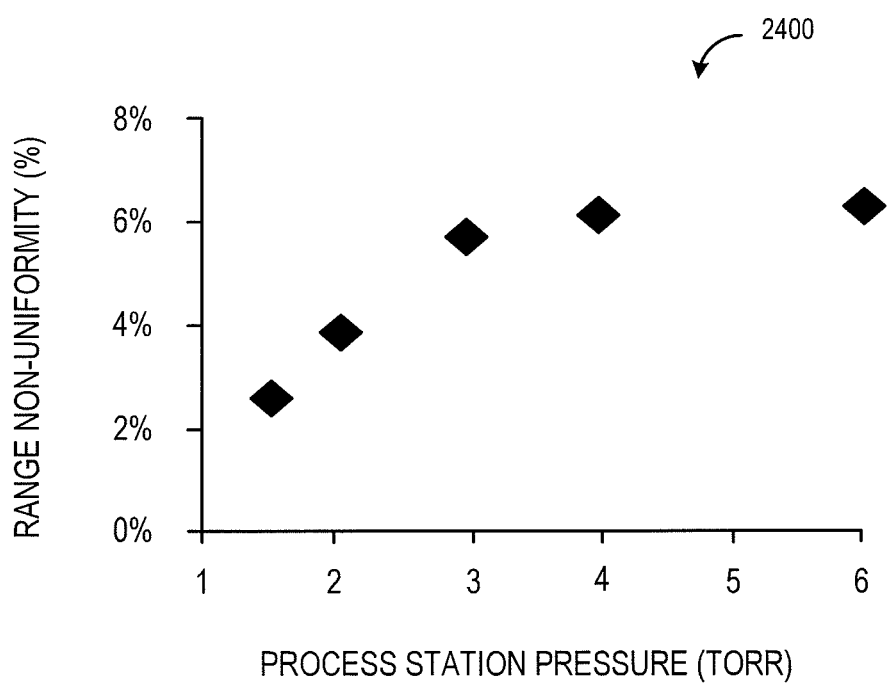
FIG. 24 graphically shows a relationship between within-substrate range non-uniformity and process station pressure for ultra-smooth PECVD $SiO_2$ films deposited according to embodiments of the present disclosure.

FIG. 24 shows a graph 2400 depicting a non-linear relationship between within-substrate range non-uniformity and process station pressure for the example films shown in Table 4. Thus, it will be appreciated from the example data provided in Table 4 and FIGS. 23 and 24 that, in some embodiments, an ultra-smooth PECVD silicon oxide film characteristic may be maintained and/or adjusted by generating the plasma at a process station pressure 8 torr or less. In one example, the deposition rate may be increased to greater than 6 Å/sec while maintaining a surface roughness of less than 3 Å (as measured on a 1000 Å film deposited on a silicon substrate). In another example, the within-substrate non-uniformity of a deposited film may be decreased to less than 3% while maintaining a surface roughness of less than 3 Å as measured on a silicon substrate.

In another example, an ultra-smooth characteristic may be substantially maintained while a deposition rate for the film is adjusted by varying an amount of an inert gas to the process station. Thus, continuing with FIG. 15, in some embodiments, controlling a process parameter to control an absolute roughness of the film surface may include, at 1516, supplying an inert gas to the plasma. For example, in some embodiments, argon may be supplied to the plasma to adjust the deposition rate of an ultra-smooth PECVD silicon dioxide film.

Figure 25:
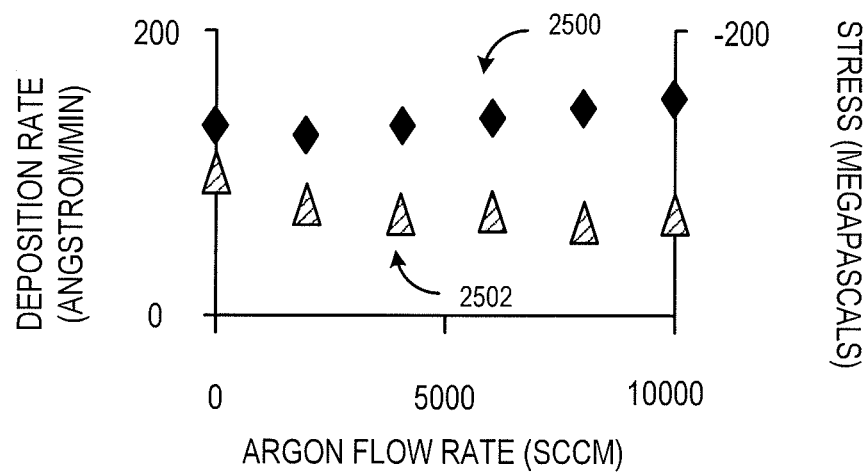
FIG. 25 graphically shows a relationship between deposition rate for ultra-smooth PECVD $SiO_2$ films deposited according to embodiments of the present disclosure and an argon flow rate.

FIG. 25 shows a relationship 2500 between deposition rate and argon flow rate to the process station for example ultra-smooth PECVD SiO₂ films deposited at 550° C. on silicon substrates. FIG. 25 also shows a relationship 2502 between SiO₂ film stress and argon flow rate to the process station. As shown in FIG. 25, the deposition rate may be increased and the SiO₂ film made more compressive, by increasing the flow rate of argon to the process station.

Figure 26:
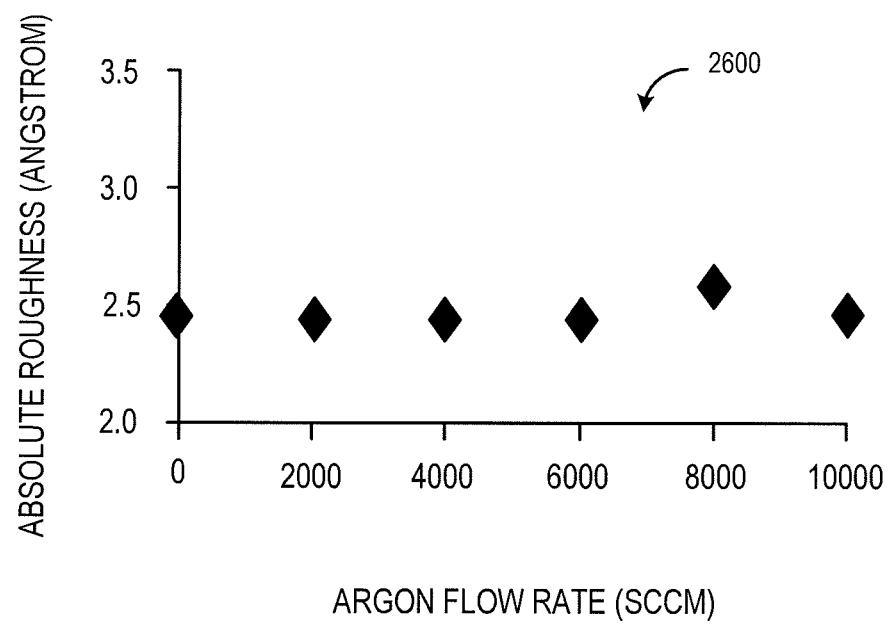
FIG. 26 graphically shows a relationship between absolute roughness of ultra-smooth PECVD $SiO_2$ films deposited according to embodiments of the present disclosure and an argon flow rate.

Further, in some embodiments, supplying inert gas to the process station may adjust the deposition rate without substantially disturbing the surface roughness of the film. For example, FIG. 26 shows an approximately constant relationship 2600 between absolute roughness and argon flow rate for the example ultra-smooth PECVD SiO₂ films shown in FIG. 25. Thus, it will be appreciated from the examples shown in FIGS. 25 and 26 that, in some embodiments, the deposition rate of an ultra-smooth PECVD film may be increased by increasing a flow rate of argon to the process station without causing an increase in surface roughness. It will be appreciated that, in some embodiments, varying the flow rates of other suitable inert gases, such as nitrogen and helium, may have similar effects.

It will be appreciated that control of the surface smoothness via control of one or more process parameters, such as reactant and inert feed rates, plasma power, ion density, and process station pressure, may be managed independently or in combination with any other suitable process variable. For example, in some embodiments, ion bombardment (e.g., from low-frequency plasma sources or from a DC bias source applied to the plasma) may provide a suitable ultra-smooth silicon-containing film. In another example, an ultra-smooth PECVD film may be deposited at temperatures of 400° C. or greater. In one scenario, an ultra-smooth PECVD silicon dioxide film may be deposited at 550° C. Such films may exhibit the ultra-smooth surfaces described herein while having comparatively lower hydrogen concentrations than films deposited at less than 400° C. Further, such films may maintain a substrate bow without the assistance of a subsequent annealing step. Such films may exhibit ultra-smooth and highly flat surfaces during a subsequent lithography step where a pattern is transferred to the film stack. Other non-limiting examples of other process variables include process station temperature, plasma ignition sequencing, plasma extinction sequencing, and a spacing between a process gas distribution showerhead and a deposition substrate surface. For example, in one scenario, a high-frequency plasma may be ignited before silane is introduced to the process station. This may condition the substrate surface for deposition prior to the beginning of deposition, which in turn may reduce the formation of surface islands or domains. In another scenario, a high-frequency plasma may be extinguished after flow rate of silane is stopped after deposition, to consume residual silane molecules in the process station.

While the examples above relate to the deposition of ultra-smooth PECVD silicon dioxide films, it will be appreciated that any suitable silicon-containing film may be deposited according to the embodiments described herein. In some embodiments, ultra-smooth PECVD silicon nitride films may be deposited by plasma-activated reaction of ammonia and silane. Further, in some embodiments, suitable silicon oxynitride films may be deposited by plasma-activation of silane and $N_2O$ in the presence of a nitrogen plasma. Other suitable nitrogen-containing reactants include, but are not limited to, hydrazine and nitrogen/helium gas mixtures.

Table 5 summarizes roughness, refractive index, and film stress data for a variety of ultra-smooth silicon nitride containing films having a refractive index ranging from approximately 1.4 to approximately 2.1. The film data presented in Table 5 was measured from 1000 Å films deposited on silicon substrates, each film generated by feeding, for the respective film recipe, the indicated amounts of nitrous oxide or ammonia to a nitrogen and helium plasma at a constant silane flow rate, nitrogen flow (approximately 5000 sccm), helium flow (approximately 8000 sccm), pressure (approximately 5 torr) and high-frequency plasma power (approximately 4500 W). As indicated in Table 5, reducing the flow of nitrous oxide fed to the plasma (shown in recipes A-G) provides a wide range of silicon oxide and silicon oxynitride films exhibiting an absolute roughness of less than approximately 3.1 Å, and in many cases, less than approximately 2.7 Å.

TABLE 5

| Recipe Name | 100% $SiH_4$ flow (sccm) | $N_2O$ flow (sccm) | $NH_3$ flow (sccm) | Stress (MPa) | Refractive Index | Ra (nm) |
|---|---|---|---|---|---|---|
| A | 40 | 12000 | 0 | −302 | 1.4617 | 0.235 |
| B | 40 | 8000 | 0 | −313 | 1.4622 | 0.231 |
| C | 40 | 4000 | 0 | −339 | 1.4615 | 0.249 |
| D | 40 | 1500 | 0 | −348 | 1.4669 | 0.266 |
| E | 40 | 500 | 0 | −355 | 1.4703 | 0.265 |
| F | 40 | 150 | 0 | −314 | 1.5051 | 0.269 |
| G | 40 | 80 | 0 | −347 | 1.6214 | 0.309 |
| H | 40 | 0 | 0 | −1824 | 1.992 | 0.755 |
| I | 40 | 0 | 300 | −1734 | 1.990 | 0.397 |
| J | 40 | 0 | 500 | −1566 | 1.982 | 0.305 |
| Conventional PECVD SiN | 980 | 0 | 7500 | +200 to −200 | 1.90-2.02 | 0.53 |

Figure 27:
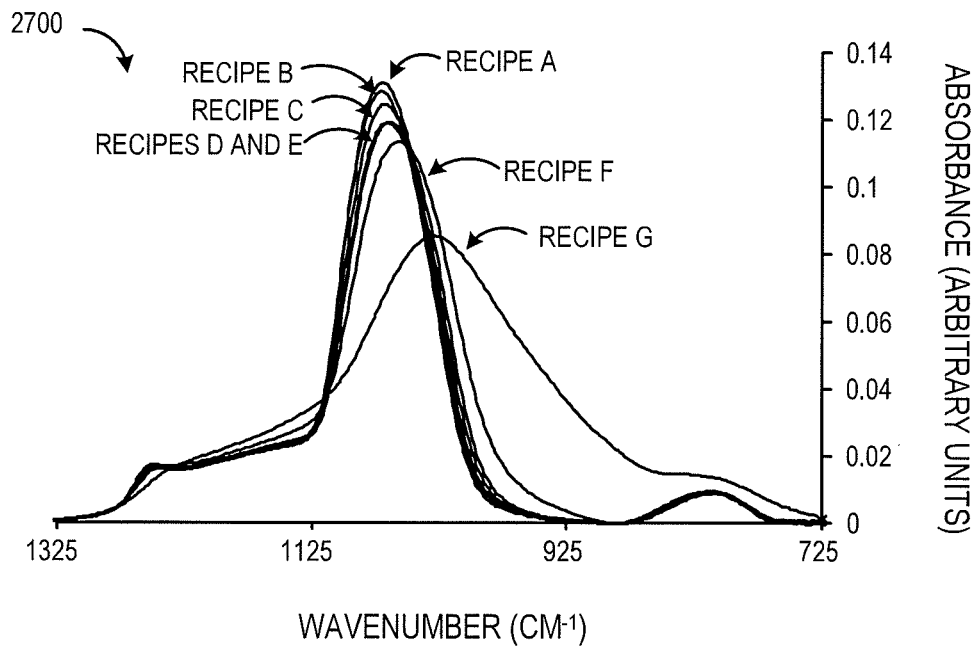
FIG. 27 graphically shows another comparison of Fourier transform infrared spectra showing Si—O bond-stretching mode data for example ultra-smooth PECVD silicon oxide and silicon oxynitride films deposited according embodiments of the present disclosure.

FIG. 27 shows a graph 2700 illustrating a comparison of Fourier transform infrared spectra showing Si—O bond stretching mode data for the example ultra-smooth PECVD silicon oxide and oxynitride films presented in Table 5. The FTIR measurements shown in FIG. 27 show a transition in Si—O bond stretch peak position as the concentration of nitrous oxide in the process station is reduced.

Figure 28:
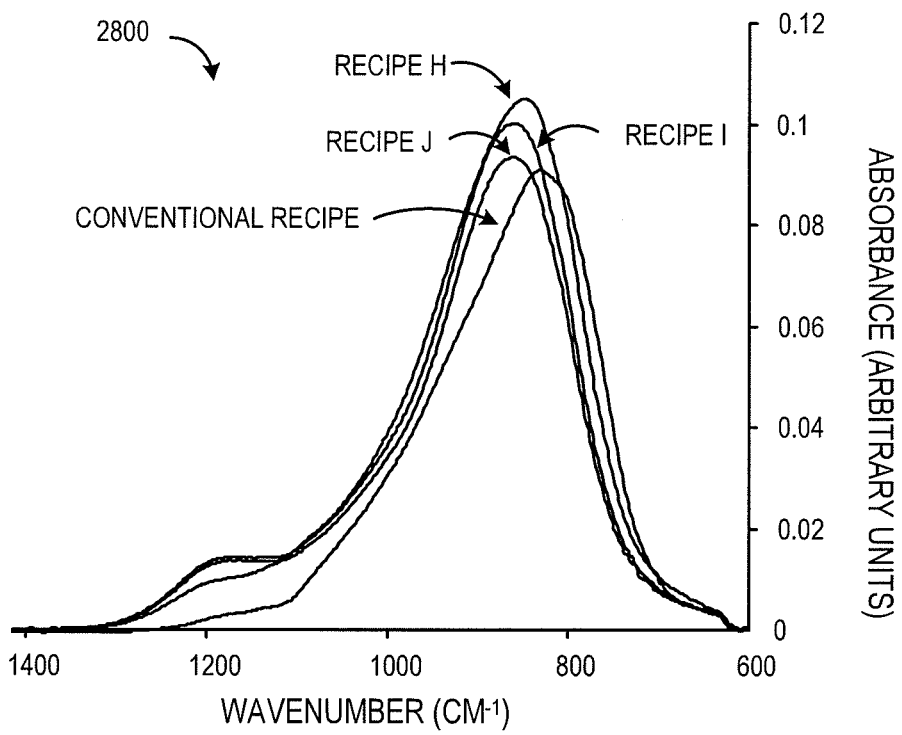
FIG. 28 graphically shows a comparison of Fourier transform infrared spectra showing Si—N bond-stretching mode data for an example conventional silicon nitride film and for example ultra-smooth PECVD silicon nitride films deposited according embodiments of the present disclosure.
Figure 29:
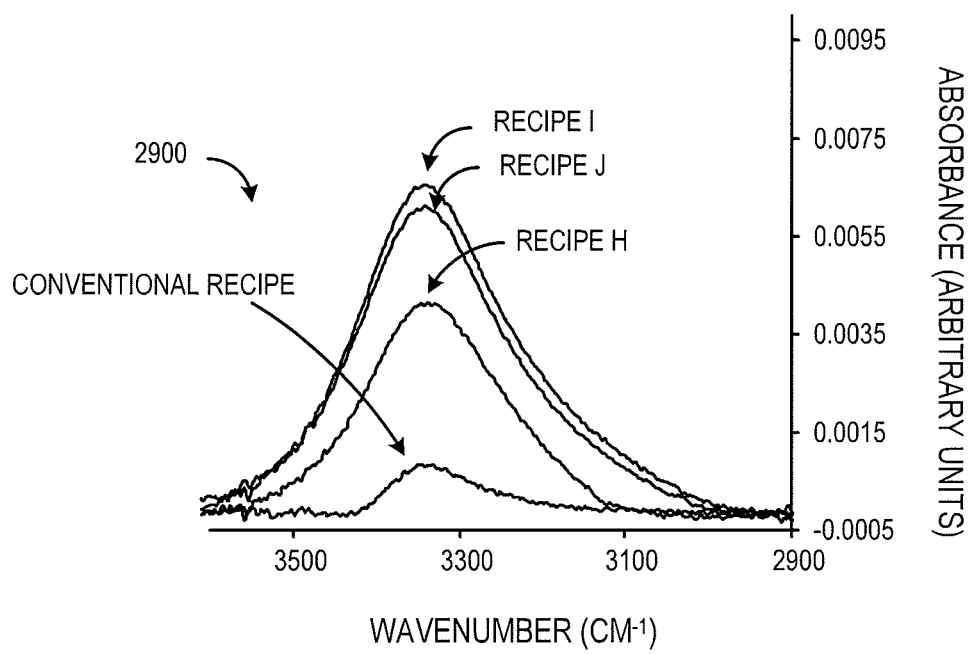
FIG. 29 graphically shows another comparison of Fourier transform infrared spectra showing N—H bond-stretching mode data for an example conventional silicon nitride film and for example ultra-smooth PECVD silicon nitride films deposited according embodiments of the present disclosure.
Figure 30:
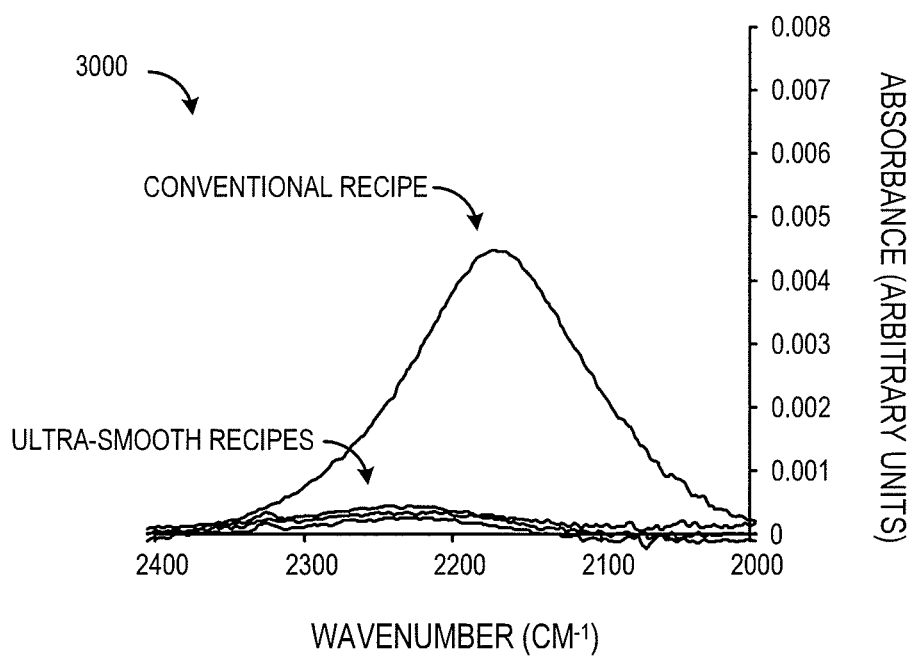
FIG. 30 graphically shows another comparison of Fourier transform infrared spectra showing Si—H bond-stretching mode data for an example conventional silicon nitride film and for example ultra-smooth PECVD silicon nitride films deposited according embodiments of the present disclosure.

The measurements presented in Table 5 also illustrate that ultra-smooth PECVD silicon nitride films having absolute roughness values of approximately 4 Å or less may be deposited by substituting ammonia for nitrous oxide at suitable flow rates. The data presented in Table 5 suggest an inverse relationship between film roughness and film stress and ammonia concentration. For comparison, film and recipe parameters for a conventional PECVD silicon nitride process are also provided in Table 5. FIGS. 28-30 depict comparisons of FTIR spectra 2800, 2900, and 3000, showing Si—N, N—H, and Si—H bond stretching modes, respectively, for the example ultra-smooth PECVD silicon nitride and conventional PECVD silicon nitride films presented in Table 5. As shown in FIGS. 28 and 29, increasing the ammonia concentration tends to shift the Si—N peak position away from the Si—N peak position of the conventional film and tends to increase the area of the N—H peak. This may suggest additional hydrogen incorporation in the film and provide an approach for tuning the film stress characteristics of the film, as supported by the stress data included in Table 5. However, FIG. 30 shows that, unlike the conventional PECVD film, the Si—H bond stretching mode is absent for the ultra-smooth PECVD silicon nitride films. This may provide a comparative improvement in breakdown voltage characteristics for the film relative to the conventional PECVD silicon nitride. Thus, it will be appreciated that, in some examples, the bulk film stress characteristics of the ultra-smooth PECVD silicon nitride film may be tuned while preserving electrical characteristics of the film.

In another example, an ultra-smooth PECVD silicon film (e.g., an amorphous silicon film, an undoped polycrystalline silicon film or a doped polycrystalline film) may be deposited from plasma decomposition of silane alone or in a suitable reducing environment, such as in the presence of a helium, argon, and/or hydrogen plasma, and, in cases where doped polycrystalline silicon is deposited, in the presence of a suitable dopant precursor (e.g., a boron-containing precursor, an arsenic-containing precursor, and/or a phosphorous-containing precursor). Such ultra-smooth PECVD silicon films may also be used to construct film stacks in-situ, and may also exhibit self-planarizing characteristics. Further, in some embodiments, ultra-smooth PECVD silicon processes may add a DC bias or another suitable ion bombardment approach to promote surface rearrangement and potentially enhance surface smoothing. Non-limiting example process parameters for depositing ultra-smooth PECVD undoped silicon films using an example four-station process tool (described in detail below) are shown in Table 6.

TABLE 6

| Parameter | Range |
|---|---|
| Pressure (torr) | 0.5 to 8.0 |
| Temperature (° C.) | 300-650 |
| He flow rate (sccm) | 0-10000 |
| Ar flow rate (sccm) | 0-10000 |
| 100% Silane flow rate (sccm) | 0.1-200 |
| $N_2O$ flow rate (sccm) | 0-30000 |
| Nitrogen flow rate (sccm) | 0-15000 |
| High-frequency plasma power (W) | 250-5000 |
| Low-frequency plasma power (W) | 0-2500 |
| Time between beginning of silane flow and plasma ignition (sec) | −3 to +3 |
| Time between end of silane flow and plasma extinction (sec) | −3 to +10 |

Further, in some embodiments, an ultra-smooth PECVD silicon film may be doped by supplying a suitable dopant during deposition or in a post-deposition treatment phase. Non-limiting examples of dopants include arsenic, boron, and phosphorous. In some embodiments, a doped silicon film may be activated by a suitable thermal anneal in-situ. For example, an ultra-smooth PECVD boron-doped silicon film deposited at 550° C. may be annealed to 650° C. without a vacuum break. In some examples, annealing a doped film may lower the resistance of the film, improve conductivity within the film and the film stack and/or reduce the amount of dopant needed to provide a selected film conductivity.

The methods described herein may be performed by any suitable apparatus. A suitable apparatus includes hardware for accomplishing the process operations and a system controller having instructions for controlling process operations in accordance with the present invention. For example, in some embodiments, the hardware may include one or more process stations included in a process tool.

The system controller will typically include one or more memory devices and one or more processors configured to execute instructions for controlling process operations so that the apparatus will perform a method in accordance with the present disclosure. For example, in some embodiments, the system controller may operate various valves, temperature controllers, plasma controllers, and pressure controllers to adjust process conditions within the apparatus. In some embodiments, machine-readable media containing instructions for controlling process operations in accordance with the present disclosure may be coupled to the system controller.

Figure 31:
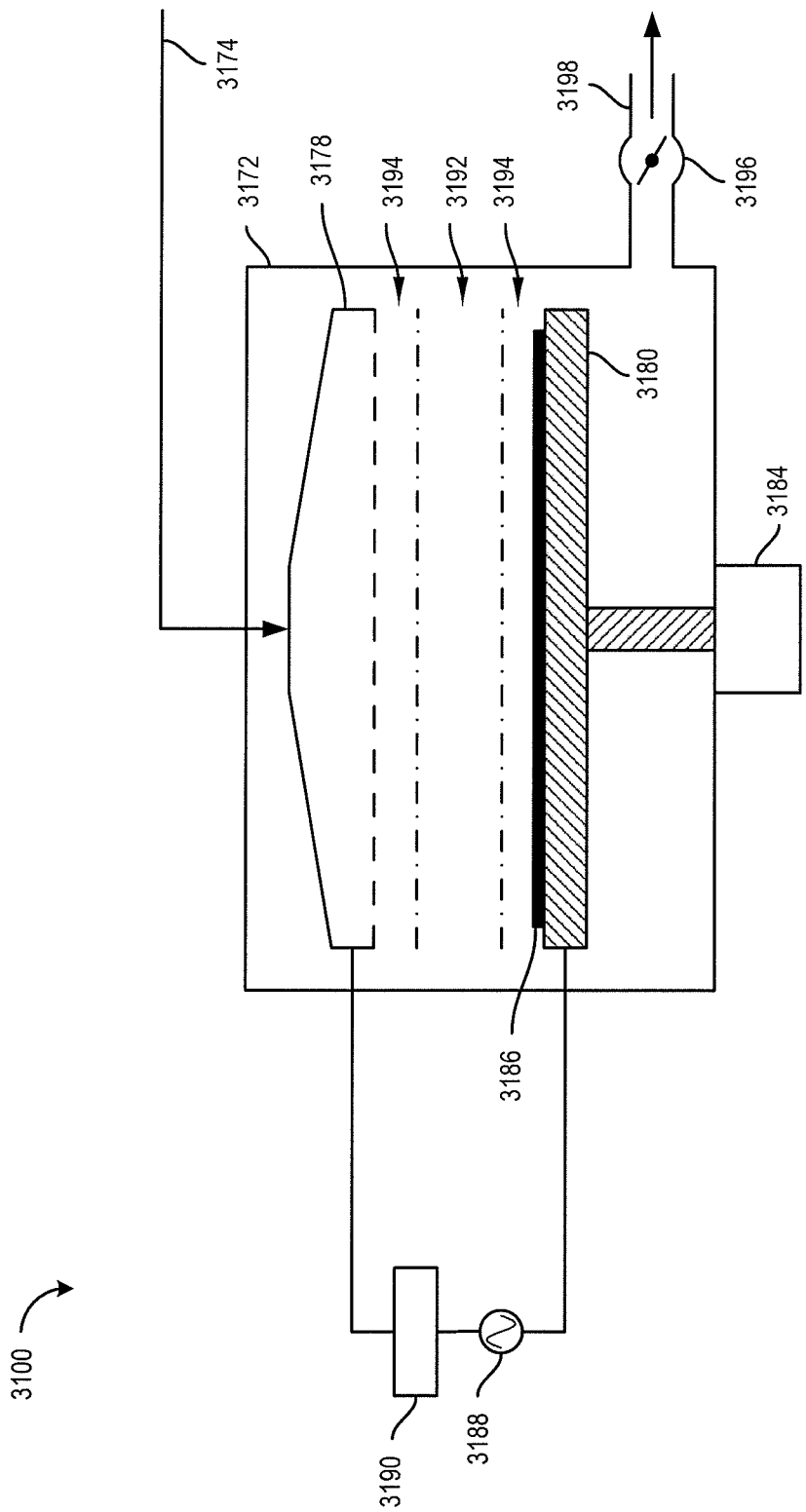
FIG. 31 schematically shows a process station according to an embodiment of the present disclosure.

For example, FIG. 31 schematically shows an example embodiment of a process station 3100. For simplicity, process station 3100 is depicted as a standalone process station having a process chamber body 3172 for maintaining a low-pressure environment. However, it will be appreciated that a plurality of process stations 3100 may be included in a common low-pressure process tool environment. Process station 3100 includes a process gas delivery line 3174 for providing process gases, such as inert gases, precursors, reactants, and treatment reactants, for delivery to process station 3100. In the example shown in FIG. 31, a showerhead 3178 is included to distribute process gases within process station 3100. Substrate 3186 is located beneath showerhead 3178, and is shown resting on a holder 3180 supported by a pedestal 3182. In some embodiments, pedestal 3182 may be configured to rotate about a vertical axis. Additionally or alternatively, pedestal 3182 may be configured to translate horizontally and/or vertically.

In some embodiments, showerhead 3178 may be a dual-plenum or multi-plenum showerhead having a plurality of sets of gas distribution holes. For example, a first set of gas distribution holes may receive gas from a first process gas delivery line and a second set of gas distribution holes may receive gas from a second process gas delivery line. Such physical isolation of process gases may provide an approach to reducing small particle generated from reaction of incompatible process gases in process gas delivery plumbing upstream of showerhead 3178.

Showerhead 3178 and holder 3180 electrically communicate with RF power supply 3188 and matching network 3190 for powering a plasma 3192. Plasma 3192 may be contained by a plasma sheath 3194 located adjacent to showerhead 3178 and holder 3180. While FIG. 31 depicts a capacitively-coupled plasma, plasma 3192 may be generated by any suitable plasma source. In one non-limiting example, plasma 3192 may include a parallel plate plasma source.

In the embodiment shown in FIG. 31, RF power supply 3188 may provide RF power of any suitable frequency. In some embodiments, RF power supply 3188 may be configured to control high- and low-frequency RF power sources independently of one another. Example low-frequency RF powers may include, but are not limited to, frequencies between 200 kHz and 2000 kHz. Example high-frequency RF powers may include, but are not limited to, frequencies between 13.56 MHz and 80 MHz. Likewise, RF power supply 3188 and matching network 3190 may be operated at any suitable power to form plasma 3192. Examples of suitable powers include, but are not limited to, powers between 250 W and 5000 W for a high-frequency plasma and powers between 0 W and 2500 W for a low-frequency plasma for a four-station multi-process tool including four 15-inch showerheads. RF power supply 3188 may be operated at any suitable duty cycle. Examples of suitable duty cycles include, but are not limited to, duty cycles of between 5% and 90%.

In some embodiments, holder 3180 may be temperature controlled via heater 3184. Further, in some embodiments, pressure control for process station 3100 may be provided by butterfly valve 3196 or by any other suitable pressure control device. As shown in FIG. 31, butterfly valve 3196 throttles a vacuum provided by a vacuum pump (not shown) fluidly coupled to process station exhaust line 3198. However, in some embodiments, pressure control of process station 3100 may also be adjusted by varying a flow rate of one or more gases introduced to process station 3100.

It will be appreciated that control of one or more process parameters may be provided locally (e.g., RF power may be controlled by a plasma controller communicating with RF power supply 3188, process station pressure may be controlled by a valve controller communicating with butterfly valve 3196 or with gas metering valves or flow controllers included coupled with process gas delivery line 3174, etc.) or under partial or total control provided by a system controller (described in more detail below) communicating with process station 3100 without departing from the scope of the present disclosure.

As described above, one or more process stations may be included in a multi-station processing tool. In some embodiments of a multi-station process tool, control and/or supply of various process inputs (e.g., process gases, plasma power, heater power, etc.) may be distributed from shared sources to a plurality of process stations included in the process tool. For example, in some embodiments, a shared plasma generator may supply plasma power to two or more process stations. In another example, a shared gas distribution manifold may supply process gases to two or more process stations.

Figure 32:
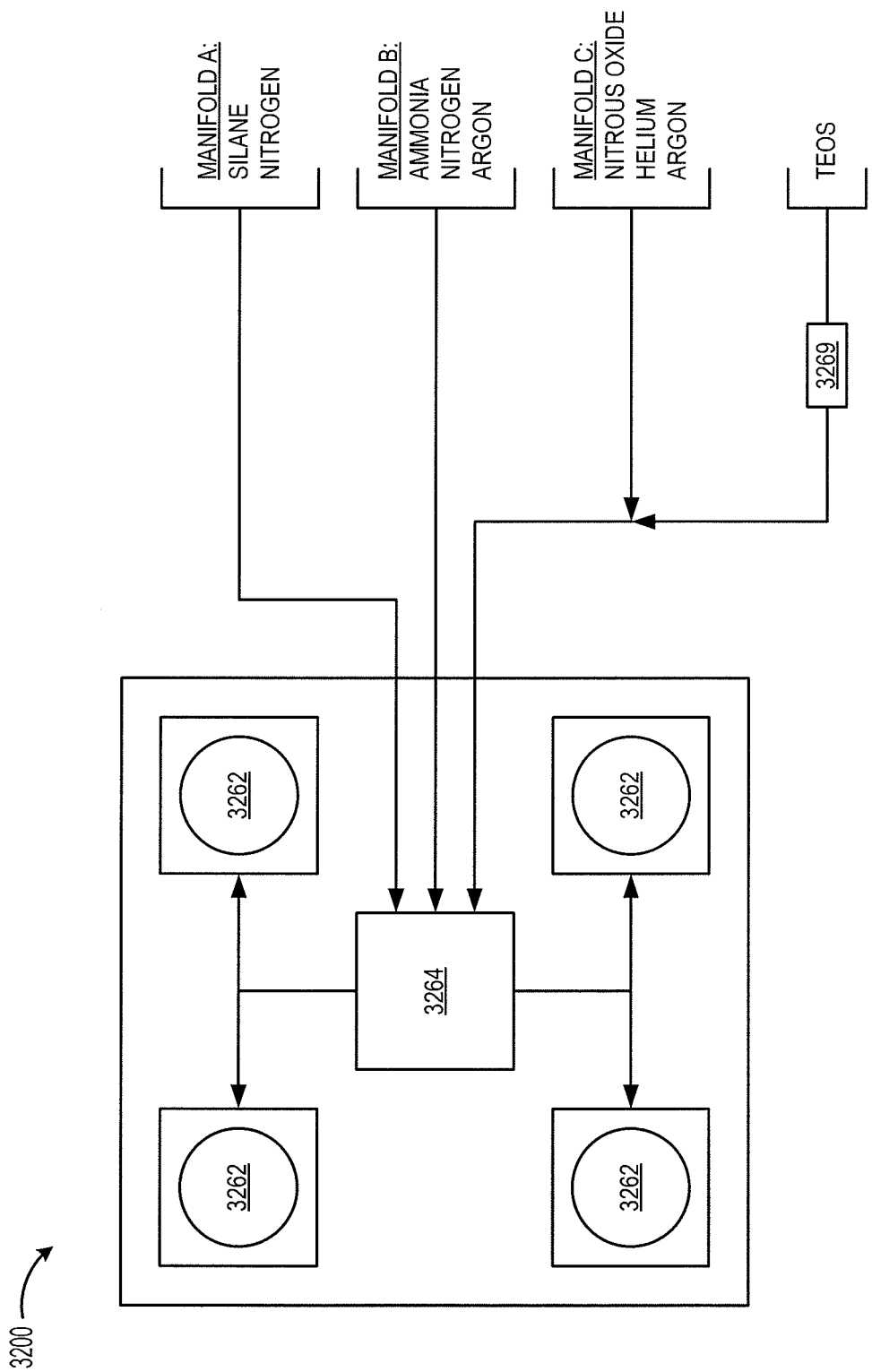
FIG. 32 schematically shows a multi-station process tool according to an embodiment of the present disclosure.

For example, FIG. 32 schematically shows an example process tool 3200, which includes a plurality of processing stations 3262 in a low-pressure environment. Each processing station 3262 is configured to deposit an ultra-smooth PECVD silane-based silicon dioxide and a silane-based silicon nitride. Each processing station 3262 is supplied by a common mixing vessel 3264 for blending and/or conditioning process gases prior to delivery to each processing station 3262.

Figure 33:
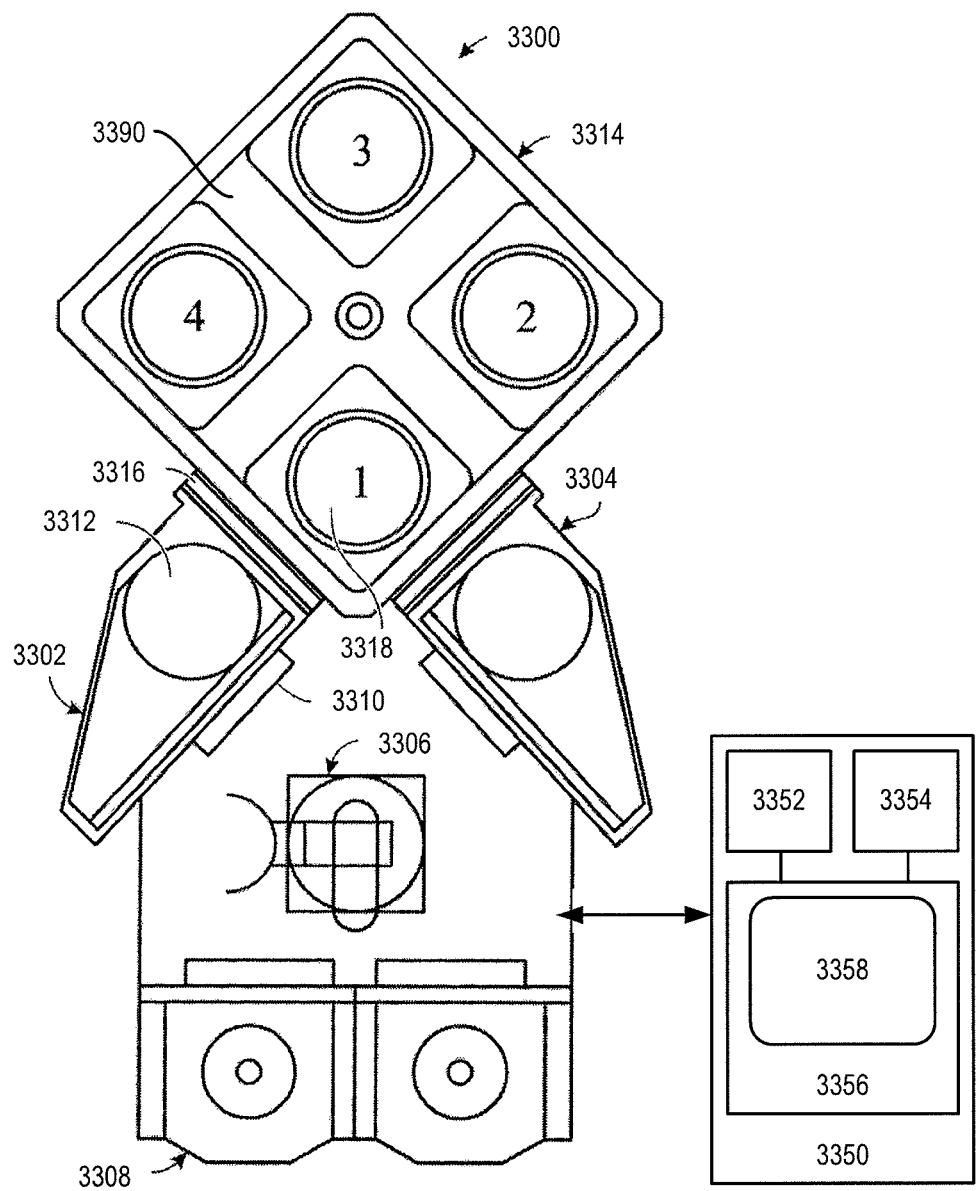
FIG. 33 schematically shows another multi-station process tool according to an embodiment of the present disclosure.

FIG. 33 shows a schematic view of an embodiment of another multi-station processing tool 3300 with an inbound load lock 3302 and an outbound load lock 3304. A robot 3306, at atmospheric pressure, is configured to move substrates from a cassette loaded through a pod 3308 into inbound load lock 3302 via an atmospheric port 3310. Inbound load lock 3302 is coupled to a vacuum source (not shown) so that, when atmospheric port 3310 is closed, inbound load lock 3302 may be pumped down. Inbound load lock 3302 also includes a chamber transport port 3316 interfaced with processing chamber 3314. Thus, when chamber transport 3316 is opened, another robot (not shown) may move the substrate from inbound load lock 3302 to a pedestal of a first process station for processing.

In some embodiments, inbound load lock 3302 may be connected to a remote plasma source (not shown) configured to supply a plasma to load lock. This may provide remote plasma treatments to a substrate positioned in inbound load lock 3302. Additionally or alternatively, in some embodiments, inbound load lock 3302 may include a heater (not shown) configured to heat a substrate. This may remove moisture and gases adsorbed on a substrate positioned in inbound load lock 3302. While the embodiment depicted in FIG. 33 includes load locks, it will be appreciated that, in some embodiments, direct entry of a substrate into a process station may be provided.

The depicted processing chamber 3314 comprises four process stations, numbered from 1 to 4 in the embodiment shown in FIG. 33. In some embodiments, processing chamber 3314 may be configured to maintain a low pressure environment so that substrates may be transferred among the process stations without experiencing a vacuum break and/or air exposure. Each process station depicted in FIG. 33 includes a process station substrate holder (shown at 3318 for station 1) and process gas delivery line inlets. In some embodiments, one or more process station substrate holders 3318 may be heated.

In some embodiments, each process station may have different or multiple purposes. For example, a process station may be switchable between an ultra-smooth PECVD process mode and a conventional PECVD or CVD mode. Additionally or alternatively, in some embodiments, processing chamber 3314 may include one or more matched pairs of ultra-smooth PECVD and conventional PECVD stations (e.g., a pair including an ultra-smooth PECVD $SiO_2$ station and a conventional PECVD SiN station). In another example, a process station may be switchable between two or more film types, so that stacks of different film types may be deposited in the same process chamber.

While the depicted processing chamber 3314 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 33 also depicts an embodiment of a substrate handling system 3390 for transferring substrates within processing chamber 3314. In some embodiments, substrate handling system 3390 may be configured to transfer substrates between various process stations and/or between a process station and a load lock. It will be appreciated that any suitable substrate handling system may be employed. Non-limiting examples include substrate carousels and substrate handling robots.

Figure 34:
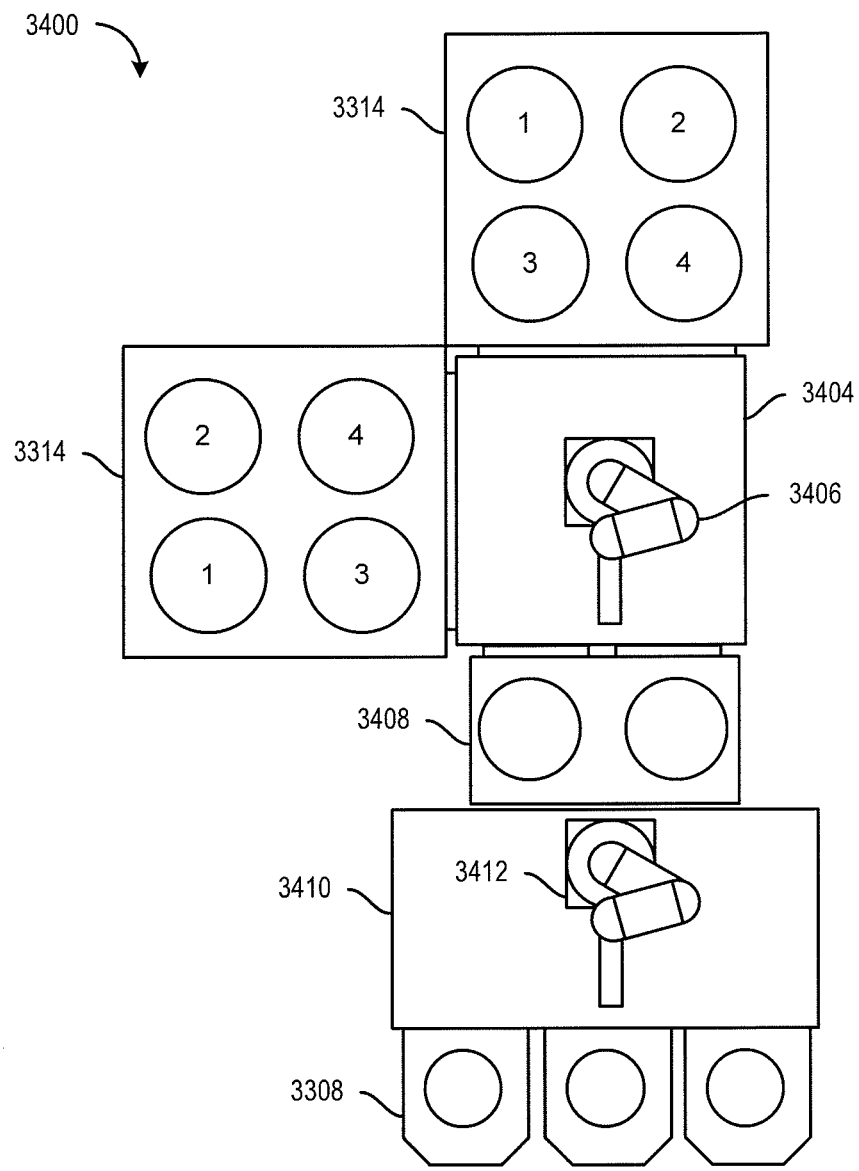
FIG. 34 schematically shows another multi-station process tool according to an embodiment of the present disclosure.

It will be appreciated that, in some embodiments, a low-pressure transfer chamber may be included in a multi-station processing tool to facilitate transfer between a plurality of processing chambers. For example, FIG. 34 schematically shows another embodiment of a multi-station processing tool 3400. In the embodiment shown in FIG. 34, multi-station processing tool 3400 includes a plurality of processing chambers 3314 including a plurality of process stations (numbered 1 through 4). Processing chambers 3314 are interfaced with a low-pressure transport chamber 3404 including a robot 3406 configured to transport substrates between processing chambers 3314 and load lock 3408. An atmospheric substrate transfer module 3410, including an atmospheric robot 3412, is configured to facilitate transfer of substrates between load lock 3408 and pod 3308.

Turning back to FIG. 33, multi-station processing tool 3300 also includes an embodiment of a system controller 3350 employed to control process conditions and hardware states of processing tool 3300. For example, in some embodiments, system controller 3350 may control one or more process parameters during an ultra-smooth PECVD film deposition phase to control an absolute roughness of the film surface. While not shown in FIG. 34, it will be appreciated that the embodiment of multi-station processing tool 3400 may include a suitable system controller like the embodiment of system controller 3350 shown in FIG. 33.

System controller 3350 may include one or more memory devices 3356, one or more mass storage devices 3354, and one or more processors 3352. Processor 3352 may include a CPU or computer, analog and/or digital input/output connections, stepper motor controller boards, etc.

In some embodiments, system controller 3350 controls all of the activities of processing tool 3300. System controller 3350 executes machine-readable system control software 3358 stored in mass storage device 3354, loaded into memory device 3356, and executed on processor 3352. System control software 3358 may include instructions for controlling the timing, mixture of gases, chamber and/or station pressure, chamber and/or station temperature, substrate temperature, target power levels, RF power levels, substrate pedestal, chuck and/or susceptor position, and other parameters of a particular process performed by processing tool 3300. System control software 3358 may be configured in any suitable way. For example, various process tool component subroutines or control objects may be written to control operation of the process tool components for performing various process tool processes. System control software 3358 may be coded in any suitable computer readable programming language.

In some embodiments, system control software 3358 may include input/output control (IOC) sequencing instructions for controlling the various parameters described above. For example, each phase of an ultra-smooth PECVD process may include one or more instructions for execution by system controller 3350. The instructions for setting process conditions for an ultra-smooth PECVD process phase may be included in a corresponding ultra-smooth PECVD recipe phase. In some embodiments, the ultra-smooth PECVD recipe phases may be sequentially arranged, so that all instructions for an ultra-smooth PECVD process phase are executed concurrently with that process phase.

Other computer software and/or programs stored on mass storage device 3354 and/or memory device 3356 associated with system controller 3350 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto process station substrate holder 3318 and to control the spacing between the substrate and other parts of processing tool 3300.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 3350. The user interface may include a display screen, graphical software displays of the apparatus and/or process conditions, and user input devices such as pointing devices, keyboards, touch screens, microphones, etc.

In some embodiments, parameters adjusted by system controller 3350 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 3350 from various process tool sensors. The signals for controlling the process may be output on the analog and digital output connections of processing tool 3300. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 3350 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, i.e. substrate, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method for forming a stack of films for a three-dimensional memory device, the method comprising depositing a plurality of films, wherein the plurality of films comprises films having a first composition and films having a second composition, different from the first composition, wherein the films having the first and second composition alternate within the stack, and wherein at least one film in the deposited stack is a silicon-containing film deposited on a substrate in a plasma-enhanced chemical vapor deposition apparatus, by a method comprising:

supplying a silicon-containing reactant to the plasma-enhanced chemical vapor deposition apparatus, wherein the silicon-containing reactant comprises one or more reactants selected from the group consisting of silane, disilane, a halogen-substituted silane, and an alkyl-substituted silane;

supplying a co-reactant to the plasma-enhanced chemical vapor deposition apparatus, wherein the co-reactant comprises one or more co-reactants selected from the group consisting of $NH_3$, $N_2O$, CO, and $CO_2$;

supplying a capacitively-coupled plasma to a process station of the plasma-enhanced chemical vapor deposition apparatus, the plasma including silicon radicals generated from the silicon-containing reactant and co-reactant radicals generated from the co-reactant; and depositing the silicon-containing film on the substrate at a deposition rate of less than 10 Å/second, the silicon-containing film being deposited under process conditions that produce a film having a refractive index of between 1.4 and 2.1, and an absolute roughness of less than 4.5 Å as measured on a silicon substrate for up to 3000 Å of deposited film, wherein the absolute roughness does not substantially increase with increasing deposited thickness for up to 3000 Å of deposited film, wherein said process conditions comprise:

supplying the co-reactant in an amount that is at least 150 times the amount of the silicon-containing reactant;

forming plasma that comprises high frequency (HF) plasma generated with a power density of at least 0.35 W/square inch, wherein the formed plasma has an ion density of less than $2 \times 10^{10}$ ions/cm$^3$;

depositing the silicon-containing film at a pressure of about 8 torr or less and at a temperature of between 300-600° C.

2. The method of claim 1, wherein the silicon-containing film is a silicon dioxide film.

3. The method of claim 1, wherein the silicon-containing film is deposited on an underlying film without an intervening vacuum break between deposition of the underlying film and the deposition of the silicon-containing film, and wherein the absolute roughness of the formed film stack is 90% or less of the absolute roughness of the underlying film.

4. The method of claim 3, wherein the underlying film is one of a polycrystalline silicon film and an amorphous silicon film.

5. The method of claim 4, wherein the underlying film includes one of a boron dopant, an arsenic dopant, and a phosphorus dopant.

6. The method of claim 3, wherein the underlying film is a silicon nitride film.

7. The method of claim 1, further comprising:
applying photoresist to the substrate;
exposing the photoresist to light;
patterning the resist with a pattern and transferring the pattern to the substrate; and
selectively removing the photoresist from the substrate.

8. The method of claim 1, wherein the silicon-containing film is deposited at a temperature of between about 400° C. and 600° C.

9. The method of claim 1, wherein the silicon-containing film is the film having the first composition, which alternates with the film having the second composition in the film stack.

10. The method of claim 1, wherein the silicon-containing film is a capping film on the film stack having alternating films having the first and second composition.

11. The method of claim 1, wherein the film having a first composition is a silicon oxide film and the film having a second composition is a silicon nitride film.

12. The method of claim 1, wherein the film having a first composition is a silicon oxide film and the film having a second composition is a polycrystalline silicon film.

13. The method of claim 1, wherein the film having a first composition is a silicon nitride film and the film having a second composition is a polycrystalline silicon film.

14. A method for forming a stack of films for a three-dimensional memory device, the method comprising depositing a plurality of films, wherein the plurality of films comprises films having a first composition and films having a second composition, different from the first composition, wherein the films having the first and second composition alternate within the stack, and wherein at least one film in the deposited stack is a silicon PECVD film deposited on a substrate in a plasma-enhanced chemical vapor deposition apparatus, by a method comprising:
supplying silane to the plasma-enhanced chemical vapor deposition apparatus;
supplying a co-reactant to the plasma-enhanced chemical vapor deposition apparatus, the co-reactant supplying a suitable reducing environment;
supplying a capacitively-coupled plasma to a process station of the plasma-enhanced chemical vapor deposition apparatus, the capacitively-coupled plasma including silicon radicals generated from the silane and co-reactant radicals generated from the co-reactant; and
depositing the silicon PECVD film on the substrate at a deposition rate of less than 10 Å/second, the silicon PECVD film being deposited under process conditions that produce a film having absolute roughness of less than 4.5 Å as measured on a silicon substrate for up to 3000 Å of deposited film, wherein the absolute roughness does not substantially increase with increasing deposited thickness for up to 3000 Å of deposited film, and wherein said process conditions comprise:
supplying the silane and other gas or gases, wherein the other gas or gases are selected from the group consisting of hydrogen, helium, argon, and combinations thereof, and are supplied in an amount that is at least 150 times the amount of silane;
forming plasma that comprises high frequency (HF) plasma generated with a power density of at least 0.35 W/square inch, wherein the formed plasma has an ion density of less than $2 \times 10^{10}$ ions/cm$^3$;
depositing the silicon film at a pressure of about 8 torr or less and at a temperature of between 300-650° C.

15. The method of claim 14, wherein the co-reactant comprises hydrogen.

16. The method of claim 14, wherein the silicon PECVD film is an amorphous silicon film.

17. The method of claim 14, wherein the silicon PECVD film is a polycrystalline silicon film.

18. The method of claim 17, wherein the silicon PECVD film includes a dopant.

19. The method of claim 18, wherein the dopant comprises at least one of boron, arsenic and phosphorus.

20. The method of claim 14, further comprising adding a DC bias to promote surface rearrangement of the silicon PECVD film.

21. The method of claim 14, further comprising applying ion bombardment to the surface of the silicon PECVD film to promote surface rearrangement of the silicon PECVD film.

22. The method of claim 14, wherein the film having a first composition is a doped silicon film and the film having a second composition is an undoped silicon film.

23. The method of claim 14, wherein the PECVD silicon film is the film having the first composition, which alternates with the film having the second composition in the film stack.

* * * * *